US008710938B2

(12) United States Patent
Bartnik et al.

(10) Patent No.: US 8,710,938 B2
(45) Date of Patent: Apr. 29, 2014

(54) ELECTRONIC DEVICE INCLUDING PREDICTED FREQUENCY ERROR ESTIMATION OF A VOLTAGE CONTROLLED OSCILLATOR AND RELATED METHODS

(75) Inventors: Grant Henry Robert Bartnik, Fergus (CA); Ryan Jeffrey Hickey, Waterloo (CA)

(73) Assignee: BlackBerry Limited, Waterloo, Ontario (CA)

( * ) Notice: Subject to any disclaimer, the term of this patent is extended or adjusted under 35 U.S.C. 154(b) by 305 days.

(21) Appl. No.: 13/197,244

(22) Filed: Aug. 3, 2011

(65) Prior Publication Data

US 2013/0033800 A1   Feb. 7, 2013

(51) Int. Cl.
*H03L 1/00* (2006.01)

(52) U.S. Cl.
USPC .............. 331/176; 331/10; 331/17; 331/18; 331/66; 331/69; 331/70

(58) Field of Classification Search
USPC ................. 331/10, 17, 18, 66, 69, 70, 176; 375/376; 455/260
See application file for complete search history.

(56) References Cited

U.S. PATENT DOCUMENTS

| | | | |
|---|---|---|---|
| 4,298,971 A | 11/1981 | Morokawa et al. | 368/204 |
| 5,170,136 A | 12/1992 | Yamakawa et al. | 331/176 |
| 6,829,534 B2 | 12/2004 | Fuchs et al. | 701/213 |
| 6,928,275 B1 | 8/2005 | Patrick et al. | 455/256 |
| 7,015,762 B1 * | 3/2006 | Nicholls et al. | 331/10 |
| 7,800,457 B2 | 9/2010 | Unkrich et al. | 331/158 |
| 7,821,958 B2 | 10/2010 | Smith et al. | 370/252 |
| 2008/0144754 A1 * | 6/2008 | Goldsmith | 375/354 |
| 2009/0278616 A1 * | 11/2009 | Nicholls et al. | 331/44 |
| 2011/0001567 A1 | 1/2011 | Nicholls et al. | |

FOREIGN PATENT DOCUMENTS

WO   2010125388   11/2010

OTHER PUBLICATIONS

B. M. Penrod, "Adaptive temperature compensation of GPS disciplined quartz and rubidium oscillators", Frequency Control Symposium, 1996, 50th, Proceedings of the 1996 IEEE Intn'l, Jun. 5-7, 1996, pp. 980-987.

* cited by examiner

*Primary Examiner* — Arnold Kinkead
*Assistant Examiner* — Richard Tan
(74) *Attorney, Agent, or Firm* — Allen, Dyer, Doppelt, Milbrath & Gilchrist, P.A.

(57) ABSTRACT

An electronic device may include a voltage controlled oscillator (VCO) and a temperature sensor. The electronic device may also include a controller configured to cooperate with the VCO and the temperature sensor to determine both a temperature and a frequency error of the VCO for each of a plurality of most recent samples. Each of the most recent samples may have a given age associated therewith. The controller may also be configured to align the temperature, the frequency error, and the given age for each of most recent samples in a three-dimensional (3D) coordinate system having respective temperature, frequency error and age axes. The controller may also be configured to estimate a predicted frequency error of the VCO based upon the aligned temperature, frequency error, and given age of the most recent samples.

28 Claims, 16 Drawing Sheets

ELECTRONIC DEVICE INCLUDING PREDICTED FREQUENCY ERROR ESTIMATION OF A VOLTAGE CONTROLLED OSCILLATOR AND RELATED METHODS

TECHNICAL FIELD

The present disclosure relates to the field of electronics, and, more particularly to electronic devices including a voltage controlled oscillator.

BACKGROUND

Mobile wireless communications systems continue to grow in popularity and have become an integral part of both personal and business communications. For example, cellular telephones allow users to place and receive voice calls almost anywhere they travel. Moreover, as cellular telephone technology has increased, so too has the functionality of cellular devices and the different types of devices available to users. For example, many cellular devices now incorporate personal digital assistant (PDA) features such as calendars, address books, task lists, etc. Moreover, such multi-function devices may also allow users to wirelessly send and receive electronic mail (email) messages and access the Internet via a cellular network and/or a wireless local area network (WLAN), for example.

Even so, as the functionality of cellular communications devices continues to increase, so too does the demand for smaller devices which are easier and more convenient for users to carry. One challenge this poses for cellular device manufacturers is designing communications circuitry, including, for example, an RF transmitter, for operational and performance stability at increased power outputs within the relatively limited amount of space available for the communications circuitry.

BRIEF DESCRIPTION OF THE DRAWINGS

FIG. 15 is a rescaled graph of the frequency error distribution graph of FIG. 14a.

DETAILED DESCRIPTION

Figure 1:
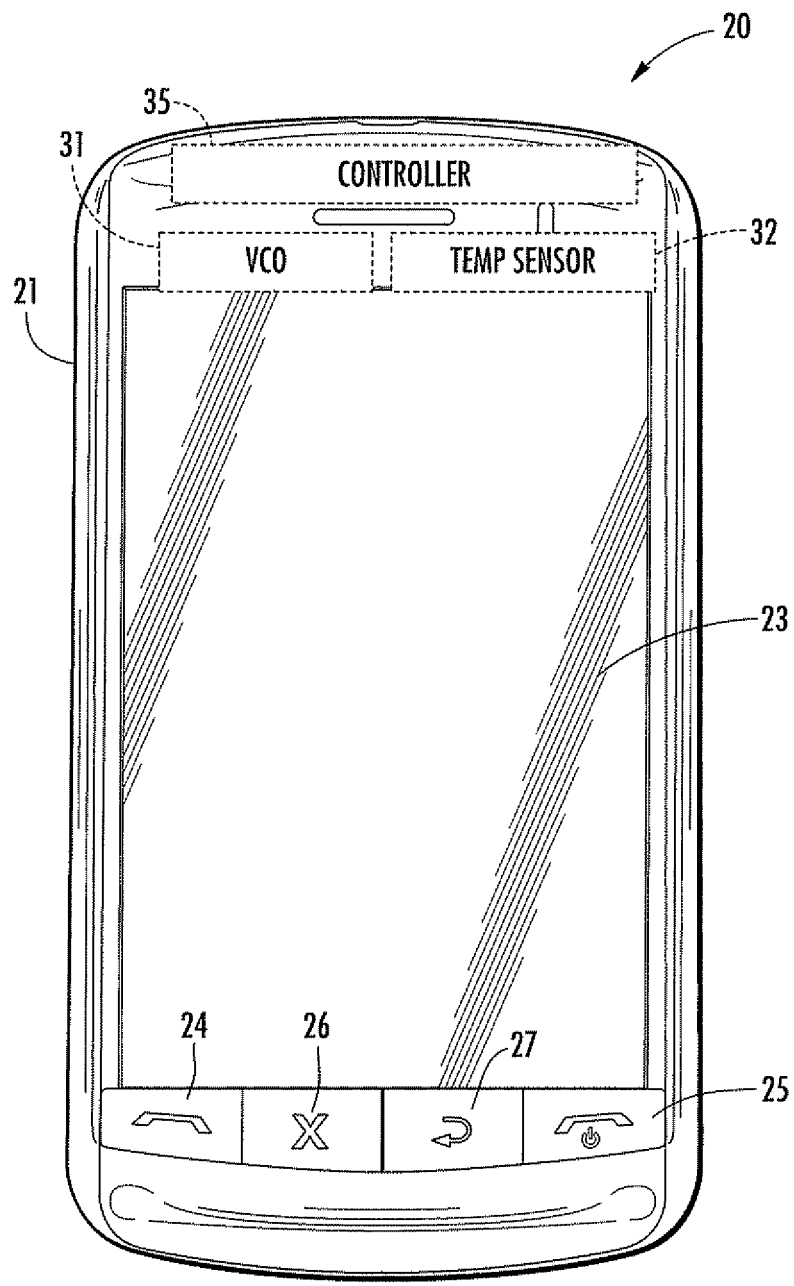
FIG. 1 is a perspective view of an electronic device including a controller configured to estimate a predicted frequency error of a VCO in accordance with an exemplary aspect.

The present description is made with reference to the accompanying drawings, in which various embodiments are shown. However, many different embodiments may be used, and thus the description should not be construed as limited to the embodiments set forth herein. Rather, these embodiments are provided so that this disclosure will be thorough and complete. Like numbers refer to like elements throughout.

An electronic device may include a voltage controlled oscillator (VCO) and a temperature sensor. The electronic device may also include a controller configured to cooperate with the VCO and the temperature sensor to determine both a temperature and a frequency error of the VCO for each of a plurality of most recent samples. Each of the plurality of most recent samples may have a given age associated therewith, for example. The controller may also be configured to align the temperature, the frequency error, and the given age for each of the plurality of most recent samples in a three-dimensional (3D) coordinate system having respective temperature, frequency error and age axes. The controller may also be configured to estimate a predicted frequency error of the VCO based upon the aligned temperature, frequency error, and given age of the plurality of most recent samples, for example.

The controller may be configured to estimate the predicted frequency error by applying a least squares estimation in the 3D coordinate system. The controller may be configured to estimate the predicted frequency error based upon a selected estimation algorithm from among a plurality of available estimation algorithms, for example.

The plurality of estimation algorithms may include first and second wireless communications signal acquisition rate algorithms. The first wireless communications signal acquisition rate algorithm may be configured to acquire a wireless communications signal at a slower rate than the second wireless communications signal acquisition rate algorithm.

The controller may be configured to select the first wireless communications signal acquisition rate algorithm based upon the predicted frequency error being above a threshold, for example. The controller may further be configured to determine a reliability value of the predicted frequency error and select the given estimation algorithm based upon the reliability value.

The controller may be configured to determine the reliability value as a probability that the predicted frequency error exceeds a threshold probability. The controller may be configured to estimate the predicted frequency error if the reliability value exceeds the threshold probability, for example.

The electronic device may further include wireless communications circuitry coupled to the controller and configured to perform at least one wireless communications function. The controller may be configured to cooperate with the wireless communications circuitry to reduce a wireless communications signal acquisition rate if the estimated predicted frequency error exceeds a threshold. The plurality of most recent samples may be less than 50. The electronic device may also include a portable housing carrying the temperature sensor, the VCO, and the controller. The electronic device may further include wireless communications circuitry coupled to the controller, for example.

A method aspect is directed to a method of operating an electronic device that includes a VCO, and a temperature sensor coupled to the VCO. The method may include sensing a temperature using the temperature sensor. The method may also include determining a frequency error of the VCO for each of a plurality of most recent samples based upon the sensed temperature, each sample having a given age associated therewith, for example. The method may also include aligning the temperature, the frequency error, and the given age for each of the plurality of most recent samples in a three-dimensional (3D) coordinate system having respective temperature, frequency error and age axes. The method may also include estimating the predicted frequency error of the VCO based upon the aligned temperature, frequency error, and given age of the plurality of most recent samples. The method may also include controlling the VCO based upon the predicted frequency error.

A related computer-readable medium aspect is directed to a non-transitory computer-readable medium for use with an electronic device, such as the one described briefly above. The non-transitory computer-readable medium may have computer-executable instructions for causing the electronic device to perform various steps. The steps may include cooperating with the VCO and the temperature sensor to determine both a frequency error of the VCO for each of a plurality of most recent samples, each having a given age associated therewith and aligning the temperature, the frequency error, and the given age for each of the plurality of most recent samples in a three-dimensional (3D) coordinate system having respective temperature, frequency error and age axes. The steps may also include estimating a predicted frequency error of the VCO based upon the aligned temperature, frequency error, and given age of the plurality of most recent samples.

Figure 2:
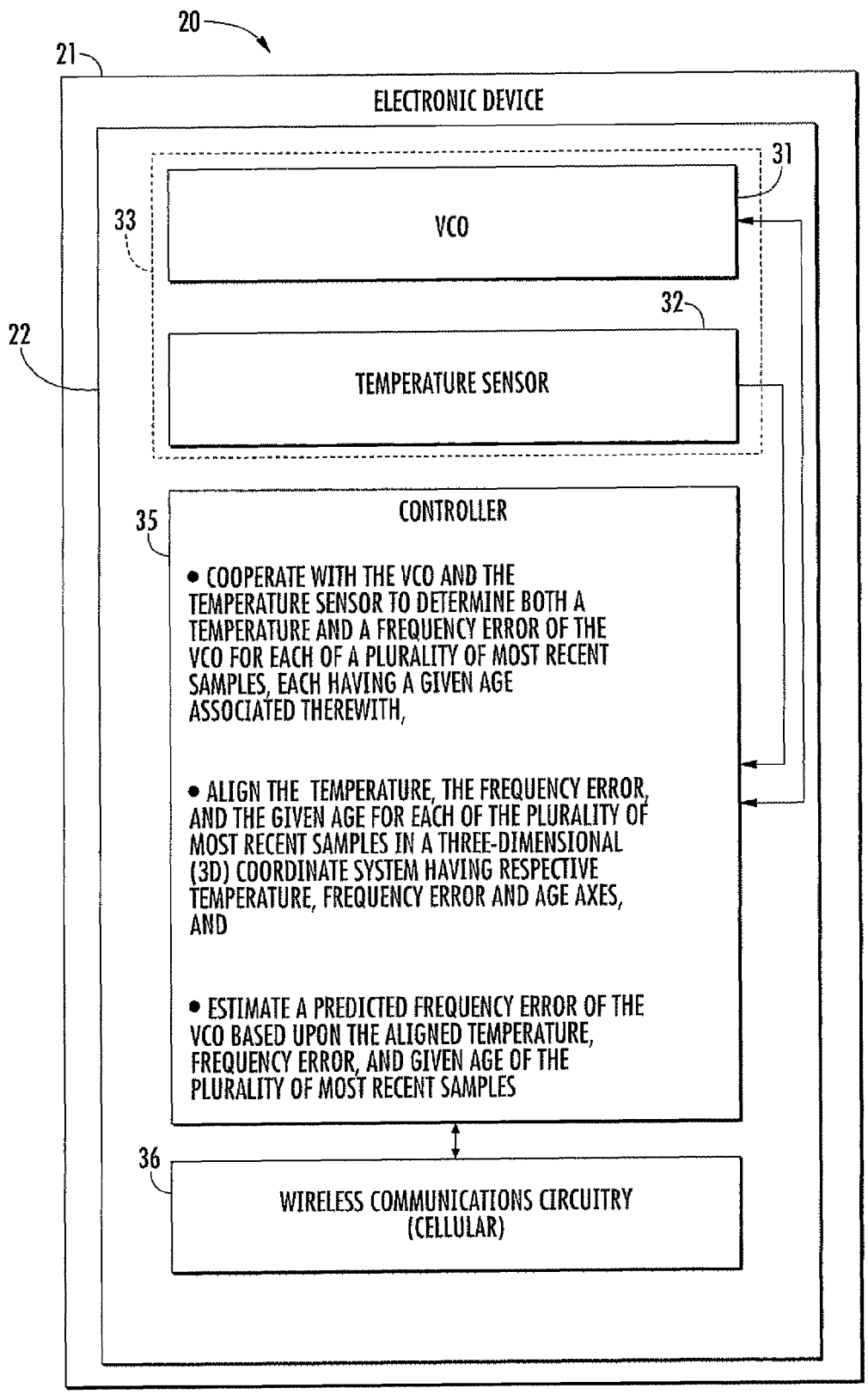
FIG. 2 is a schematic block diagram of a portion of the electronic device of FIG. 1.
Figure 3:
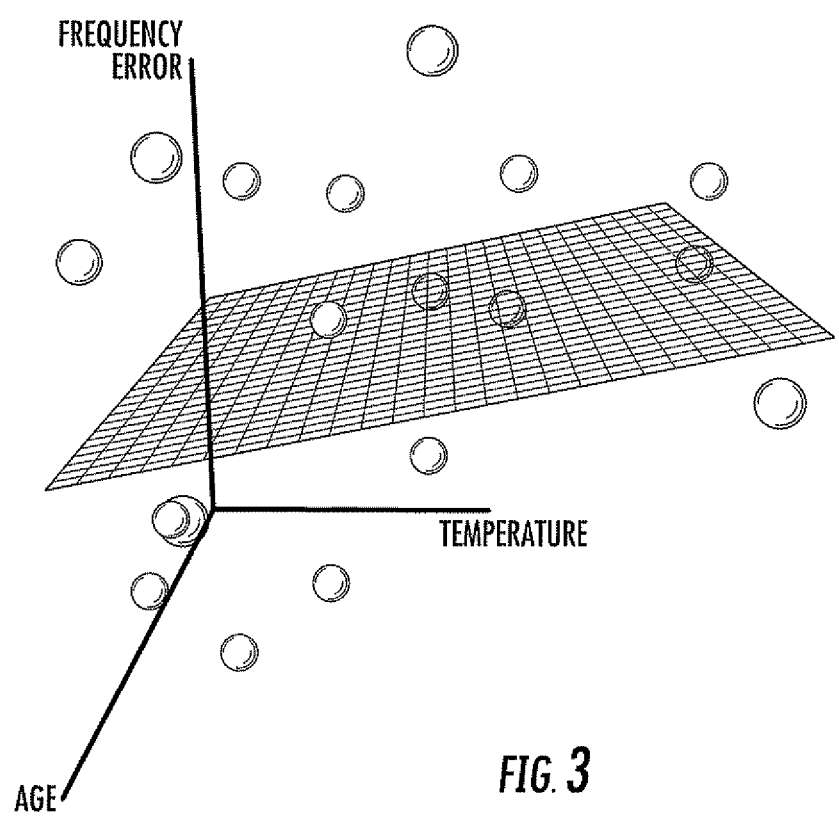
FIG. 3 is a graph of temperature, age, and frequency error along the x, y, and z axis, respectively, in accordance with an exemplary aspect.

Referring initially to FIGS. 1-3, an electronic device 20, which may be, for example, a mobile wireless communications device, and in particular a cellular communications device, illustratively includes a portable housing 21, a printed circuit board (PCB) 22 carried by the portable housing. In some embodiments, not shown, the PCB 22 may be replaced by or used in conjunction with a metal chassis or other substrate. The PCB 22 may also include a conductive layer defining a ground plane (not shown).

The exemplary electronic device 20 further illustratively includes a display 23 and a plurality of control keys including an "off hook" (i.e., initiate phone call) key 24, an "on hook" (i.e., discontinue phone call) key 25, a menu key 26, and a return or escape key 27. Operation of the various device components and input keys, etc., will be described further below with reference to FIG. 19.

The electronic device 20 also includes a voltage controlled oscillator (VCO) 31 and a temperature sensor 32. The VCO 31 and the temperature sensor 32 may cooperate as a voltage controlled temperature compensated crystal oscillator 33, for example, as will be appreciated by those skilled in the art. In other words the VCO 31 and the temperature sensor 32 cooperate to include temperature compensation of the VCO. In contrast, a VCO without a temperature sensor lacks temperature compensation features which restrict the dynamic range of an expected frequency error, for example.

The electronic device 20 also includes a controller 35 configured to cooperate with the VCO 31 and the temperature sensor 32 to determine both a temperature and a frequency error of the VCO for each of a plurality of most recent samples. Each sample has a given age associated therewith. The term frequency error may be interpreted either as the deviation of the VCO oscillation frequency from a known reference point or a difference between a predicted frequency offset and the actual frequency error. The term frequency drift may be synonymous with frequency error, though is typically used when referring to frequency error as a result of elapsed time/aging, as will be appreciated by those skilled in the art.

The number N of the plurality of most recent samples is determined by a sliding window length parameter and is a configurable or adjustable parameter. The number N of the plurality of most recent samples is less than 50, and may be 20, for example. The number N of the plurality of most recent samples may be no less than 3, for example.

The controller 35 is configured to align the temperature, the frequency error, and the given age for each of the plurality of most recent samples in a three-dimensional (3D) coordinate system having respective temperature, frequency error and age axes. In particular, the controller 35 uses the N most recent samples to fit a plane in the 3D space formed by aligning temperature, age and frequency error along the x, z and y axis respectively (FIG. 3).

The controller 35 is further configured to estimate a predicted frequency error of the VCO based upon the aligned temperature, frequency error, and given age of the plurality of most recent samples. In particular, the parameters of the plane are used to estimate frequency error at acquisition time.

Indeed, as will be appreciated by those skilled in the art, the electronic device 20 advantageously allows for the tracking of and compensation for changing physical characteristics of a crystal oscillator which is used as a reference when converting to/from a digital baseband signal to/from a signal at a given radio frequency via the wireless communications circuitry 36, for example.

The physical characteristic that is addressed is the change in the crystal oscillator reference oscillation frequency. Without such compensation, over time and, subject to other changing environmental conditions (like temperature variation), the accuracy of the conversion process may be increasingly affected, resulting in a failure of the conversion and ultimately the radio communication subsystem of the electronic device 20.

The controller 35 also computes a reliability estimate, which is a function of the variation and number of sample points used, for example. The reliability estimate allows the algorithm to change its behavior based upon the reliability of an estimate. In particular, the controller 35 assumes a frequency digital-to-analog conversion with respect to temperature and age varies following a Gaussian distribution. From this, the algorithm computes thresholds whereby its own predicted values (which are predicted using the 1st order polynomial equation of the fitted plane) can be trusted with a probability of 0.999999, which may be tunable, as will be appreciated by those skilled in the art. If these thresholds violate a known limit (which in this case may reflect an underlying hardware constraint), the algorithm resorts to a much more conservative action. The thresholds are also represented as 2nd order polynomial equations, which graphically can be thought of elliptical paraboloids in three dimensions. The electronic device 20 facilitates initial signal acquisition of wide-band code-division multiple access (WCDMA) signals, for example via the wireless communications circuitry 36, for example. The controller 35 may cooperate with the wireless communications circuitry 36 to acquire or set acquisition rates for other signals, as will be appreciated by those skilled in the art, and as will be described in further detail below.

When compared prior automatic frequency control (AFC) aging approaches, the present embodiments shift away from a table-based approach to a statistical one. Rather than populating and referencing a table indexed by temperature for frequency error estimates at acquisition time, the controller 35 evaluates a function of the current temperature/time to estimate the frequency error. The parameters of the function are determined by way of least-squares estimation procedure utilizing the N previous data points resulting from successful acquisitions of the form: [temperature, age, frequency error].

Given that the controller 35 uses or executes a single equation to estimate frequency error for a given temperature/age, it implicitly performs linear interpolation and extrapolation. As will be appreciated by those skilled in the art, this feature may most greatly contribute to the increased accuracy and reduced reliance on safe acquisitions when compared to prior approaches.

As will be appreciated by those skilled in the art, the present embodiments advantageously accommodate different patterns of frequency drift and temperature response. During the lifetime of the electronic device 20, or more particularly, the mobile wireless communications device, the frequency drift due to age will change in both magnitude and direction. Similarly, it is also possible that the temperature response characteristics will change. Such changes are addressed by the present embodiments.

To address cases where extrapolation may be unreliable, another equation is parameterized to determine if, for a given temperature/age, the estimation equation can be trusted to produce a reliable estimate. Commonly referred to as a prediction interval, the equation makes assumptions about the distribution of error associated with the coefficients of the estimation equation (chiefly that they follow a Gaussian distribution). The distribution of the plurality of most recent samples or N data points used to parameterize the estimation equation determine the parameters of the prediction interval equation.

If the data are well-predicted by the fitted plane and distributed evenly through the 3D parameter space, the prediction interval will likely permit significant amounts of extrapolation. If however any of these conditions are not met, the prediction interval will typically shrink and the algorithm will behave more conservatively. Ultimately the evaluation of the prediction interval reduces to determining if, with a sufficiently small probability ($1\times10^{-6}$), the frequency error for a given temperature/age is smaller than a pre-determined tolerance band, for example, +/−6000 Hz at a baseband frequency. The tolerance value is typically not a tunable or adjustable parameter of the algorithm, but instead it is typically a constant related to the scanning employed during acquisition. If the prediction interval is smaller than the tolerance value, the controller 35 proceeds with estimating the frequency error via evaluation of the frequency error estimation equation. The probability of exceeding the tolerance level is tunable or adjustable and relates directly to the number of safe acquisition attempts that are made. For example, the probability of $1.0/(1.0*10^6)$ noted above corresponds to an incorrect prediction interval 1/1,000,000 times.

Figure 4:
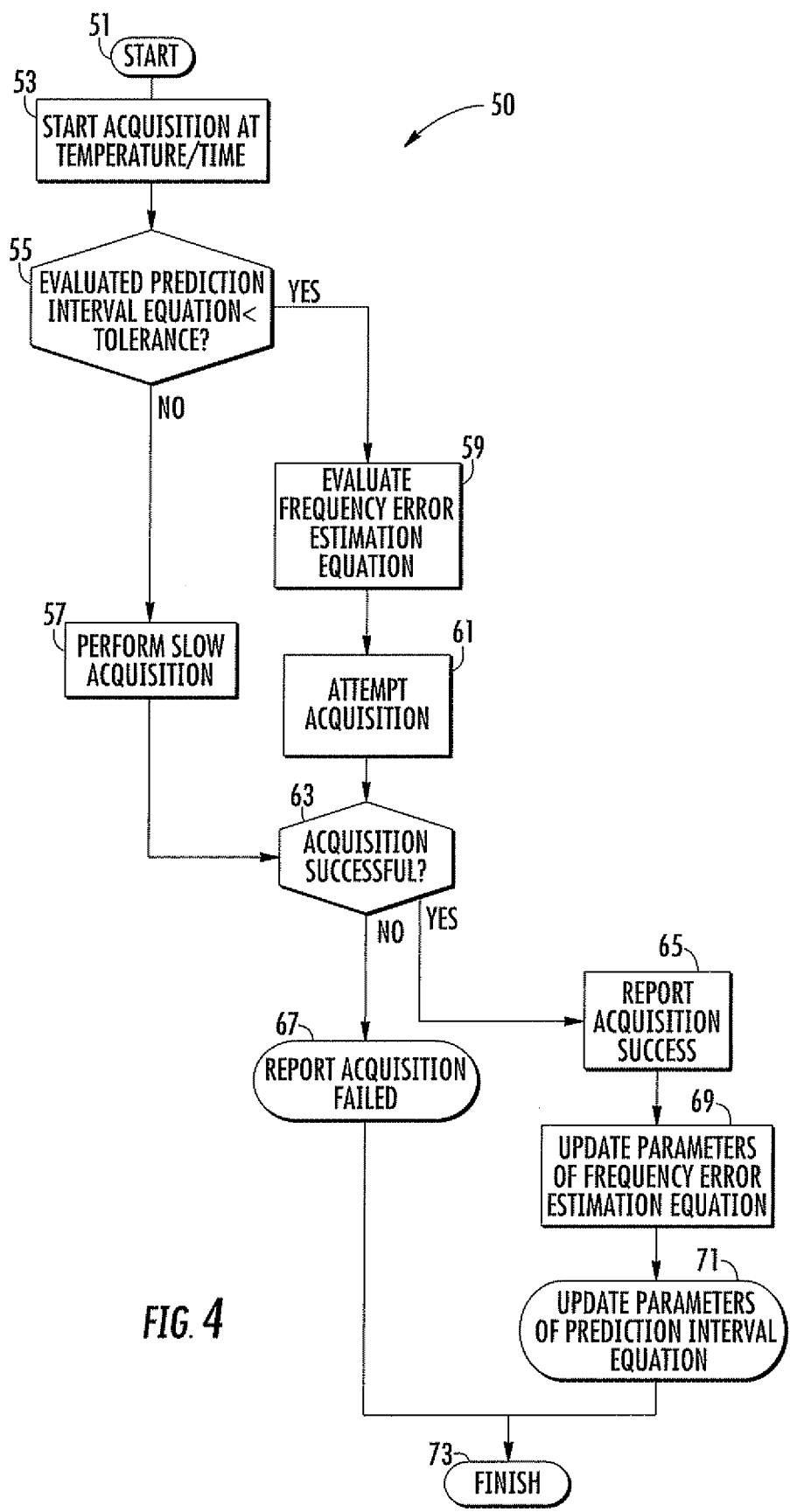
FIG. 4 is a flowchart of an automatic frequency control/acquisition process in accordance with an exemplary aspect.

The controller 35 includes or cooperates with an acquisition module to provide an acquisition function. The acquisition function of the controller 35, i.e. the acquisition module, is further described with reference to the flowchart 50 in FIG. 4. Starting at Block 51, temperature and time samples are acquired at Block 53. At Block 55, the predication interval is calculated and evaluated to determine whether it is within, or less than, a tolerance. If the prediction interval is outside the threshold, a relatively slow acquisition is performed at Block 57. Alternatively, if the prediction interval is within the threshold, the frequency error estimation equation is evaluated to determine a predicted frequency error (Block 59). Acquisition of the signal, for example, a WCDMA signal, is performed at Block 61 based upon the frequency error estimation and at a relatively higher rate than if the prediction interval is outside the threshold.

After the acquisition of the signal, at either rate, i.e. from Blocks 57 and 61, the controller 35 determines whether the acquisition was successful at Block 63. Based upon the determination of whether the acquisition was successful, the controller 35 may report a successful acquisition, Block 65, or an unsuccessful acquisition, Block 67. Reporting may include displaying an error message on the display 23, providing a report or notification to other hardware, or other reporting as will be appreciated by those skilled in the art.

If the acquisition was determined to be successful, the parameters of the frequency error estimation equation are updated at Block 69. Thereafter, the parameters of the prediction interval equation are also updated at Block 71. After updating of the prediction interval equation parameters or reporting of a failed acquisition, the method ends at Block 73.

As compared to prior approaches and noted above, the controller 35 during the acquisition process performs an evaluation of the prediction interval estimation equation to determine if a fast acquisition should be attempted and the evaluation of the frequency error estimation equation to actually compute the estimated frequency error. In prior current table-based implementation, these steps are typically combined into a single lookup into the table for a given temperature index, resulting in either an acceptable automatic frequency control digital-to-analog controller (AFCDAC) value being returned or an invalid value being returned in which case a safe acquisition is performed. In the present embodiments, the possible returning of an invalid indicator is replaced by the prediction interval exceeding the tolerance value, while the retrieval of a valid AFCDAC value is replaced by the evaluation of the frequency error estimation equation.

The controller 35 also computes a prediction interval estimation via a predication estimation module. More particularly, the controller 35 is configured to compute a statistically sound prediction interval for the frequency error estimation as a function of the plurality of most recent samples, or N data points, inside the window, the t-distribution with N−3 degrees of freedom and a given temperature/time. The prediction interval is symmetric about the fitted plane and defines with a given probability the likely range of temperature/time values for which a frequency error can be computed reliably. Additional details of this calculation will be explained in further detail below.

The t-distribution is employed as it follows naturally given the assumptions that frequency error originates from multiple source, for example, NodeB frequency error (+/−0.1 ppm), Doppler-shift, voltage supply noise to the VCO 31 and temperature sensor 32, VCO and temperature sensor temperature response hysteresis, and VCO and temperature sensor aging. Usage of the t-distribution also follows from assumptions regarding the distribution of these sources of error, namely that they follow a Gaussian distribution.

Figure 5:
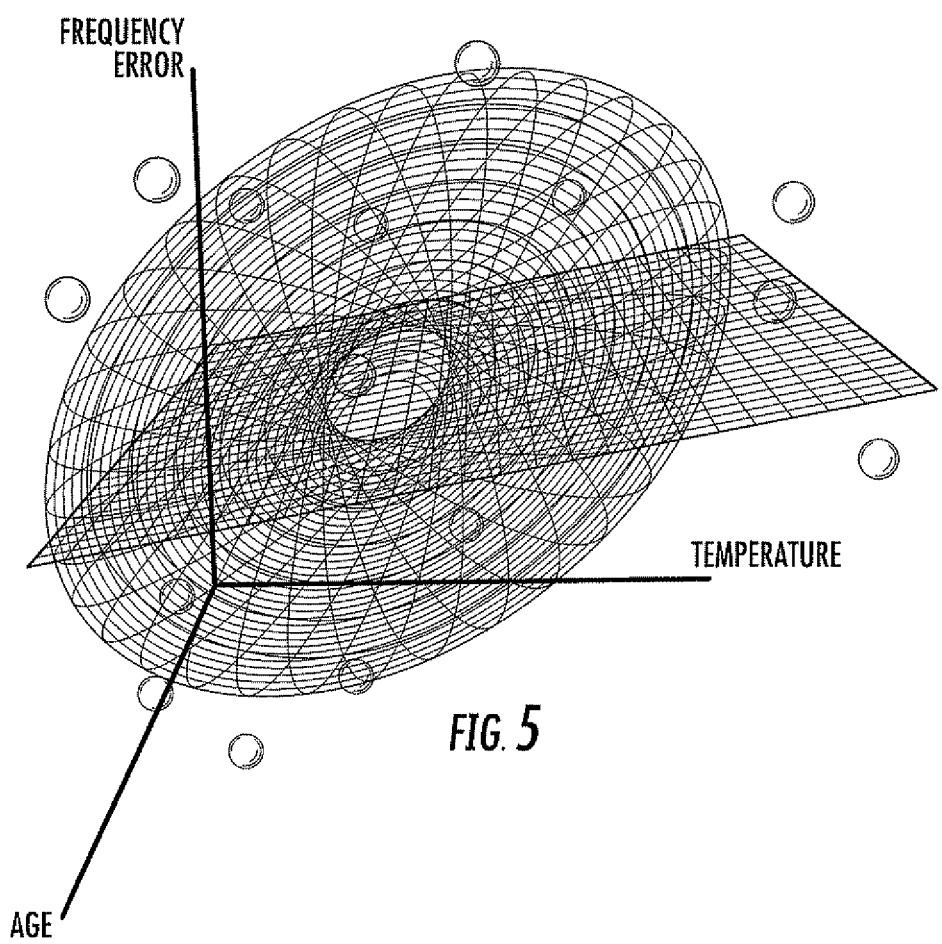
FIG. 5 is a graph of temperature, age, and frequency error along the x, y, and z axis, respectively, with an ellipsoid superimposed in accordance with an exemplary aspect.

A result of this calculation is the influence of the covariance structure of temperature and time as predictors of frequency error. If, for example, the frequency error of the VCO 31 is heavily influenced by temperature more so than age (which would be the case after the "knee" of the logarithmic aging curve is reached), then the prediction interval's "shape" will be altered to reflect this. In other words, though the prediction interval ultimately computes a 1-dimensional interval for frequency error given a specific temperature and time value, it is, in part, a function of temperature and time, and may therefore take on many different forms depending on the influence of temperature and time on frequency error. Thus, the prediction interval relates to a 3D space defining which combinations of temperature/time parameters that will result in a safe acquisition or a fast acquisition. This is illustrated in the graph of FIG. 5, where an ellipsoid has been plotted with respect to the concentration of points in FIG. 3 and can be conceptually thought of as defining the region wherein a fast acquisition should be performed. That is, points within the sphere result in a fast acquisition where points outside result in a safe acquisition).

It should be noted that the ellipsoid is not drawn to scale, but rather is symbolic of the notion of a prediction space defined by the covariance structure of temperature and time as predictors of frequency error, which also influence the coefficients of the frequency estimation plane. In reality, the ellipsoid would be considerably larger, encompassing all points in the plot by a considerable margin. What is consistent between what is indicated in the graph of FIG. 5 and a real-world scenario, for example, is that the center of mass of the ellipsoid intersects the center of the plane. This can be interpreted as the mean frequency error and the point at which, in terms of temperature and time, the predicted frequency error will be most trustworthy. Similarly, the ellipsoid is widest at this intersection, which indicates the greatest range from temperature/time values that will lead to a reliable estimate.

With respect to a frequency error estimation module or function of the controller 35, the frequency error estimation equation is the equation of the plane in FIGS. 3 and 5 and is computed, via a linear least-squares optimization, which will be described in further detail below, over N [frequency error, temperature, time] sample points in the window. The equation may be evaluated for any temperature or age value to generate a frequency error estimate. As such, the equation implicitly interpolates and extrapolates between and beyond the data points (the spheres illustrated in the graphs in FIGS. 3 and 5), which were used for fitting.

When the electronic device 20 is powered on for the first time, for example, and, consequently, there are no sample points with which to fit a plane, a safe acquisition, for example, at a slower speed, may be performed centered upon the AFCDAC value recorded during a calibration. If the acquisition succeeds, the corresponding frequency error, temperature and time are recorded as the first sample point in the window. It may be useful to fit a line during this phase to compensate for the effects of temperature until enough data has been accumulated to consider both temperature and time predictor variables.

Another consideration is to use an auxiliary source of frequency error sample points like that returned from a physical layer protocol (PLP) concerning an active dedicated physical channel (DPCH). This approach is particularly useful as it may allow for relatively rapid population of the window with a diverse range of temperature values, however it may also relatively quickly saturate the window and, as such, may adversely affect the accuracy of the estimate of the age coefficient of the equation.

With respect to bounding of the frequency error estimates, it may be possible, however improbable, that the controller 35 implementing the above-described AFC aging algorithm will receive a series of data samples that may not be representative of the underlying VCO 31. This may be the case during extended periods of Doppler-induced frequency error, for example. The window size parameter coarsely defines the sensitivity to such occurrences with larger window sizes corresponding to more resiliency. The Doppler-induced frequency error, during evaluating of the algorithm, has relatively little effect on the integrity of the algorithm. Thus, it may generally not be sufficient to rely on simulation results as a basis for deciding whether to address the issue.

Thus, the time period during initial mobile use where the window is not fully populated may be of particular interest. It is during this time that the algorithm is increasingly sensitive to unrepresentative sample points as there may be 4-5 total sample points used to fit the plane, and as such, 1-2 unrepresentative samples will generally have an increased influence.

To address this, minimum and maximum coefficients values may be used so that the response to age and temperature does not exceed a given interval. As will be appreciated by those skilled in the art, there are mathematical implications regarding fitting a plane to sample points with restrictions on the resulting output (as would be the case if the aforementioned coefficients intervals were employed).

There are several options to address this feature. A first option is to implement the constrained optimization procedure to fit a plane to data subject to constraints on the coefficients. Another option may be to bound the coefficient and accept that the plane will not be optimal, but near-optimal if the interval is ever exceeded. Still further, another option is, in the event that the interval is exceeded, to fall back to employing a single best-guess of the frequency error, which corresponds to the mean of the values in the window. Yet another option is, if the interval is exceeded, employ a safe acquisition, as will be appreciated by those skilled in the art. Additional options may be available, and may be used in conjunction with one another, as will be appreciated by those skilled in the art.

Referring again to the acquisition process employed by the controller 35, the controller, by way of the alternatively implemented functions described above, interfaces with the frequency error estimation module and the prediction interval estimation module. The interface between the acquisition module and the frequency error estimation module is bi-directional, in that the acquisition module will both retrieve values from the frequency estimation module, as is the case during acquisition when a frequency error is computed for a given temperature/time, and pass new parameters to the module which are then used to calculate new frequency estimation equation coefficients. This is the case after a successful acquisition has been performed.

Specifically, the acquisition module evaluates the frequency error estimation equation for a given temperature/time and provides new sample points to the frequency error estimation module which are used to refit the plane. The interface between the prediction interval estimation module and the acquisition module is unidirectional as the prediction interval equation is evaluated but not updated directly by the acquisition module. The update procedure occurs asynchronously after acquisition has succeeded, which may not introduce additional latency into the acquisition procedure. Additional details regarding the update procedure with respect to latency will be described below.

The updating of the prediction interval estimation equation uses a covariance matrix computed during the fitting of the frequency error estimation plane. In this way, the prediction interval estimation module also interfaces in a unidirectional way with the frequency error estimation module. In terms of actual parameters, the prediction interval estimation equation is typically evaluated by the acquisition module for a given temperature/time and is re-parameterized each time the frequency error estimation equation is updated (after each successful acquisition). The exchange along the interface between the prediction interval estimation module and the frequency error estimation module takes the form of a new covariance matrix which is generated after each frequency error estimation equation update.

The functions or algorithm of the controller 35 described herein are inherently statistical in nature. In particular, the AFC Aging problem was framed as a function approximation problem wherein the function to be estimated is that of the VCO frequency response to temperature and time. For further simplification, assumptions regarding the nature of the response (e.g. independent, identically Gaussian distributed), the number of samples required to make valid predictions (window size or N=20) and the form of the underlying model itself (linear in terms of temperature and time) were made. The result is an algorithm which uses 20 sample points to parameterize two equations: the actual frequency estimation equation which is used to predict frequency error from temperature and timestamp and another equation which characterizes the "reliability" of the former in terms of the range of the predicted frequency error.

Figure 6:
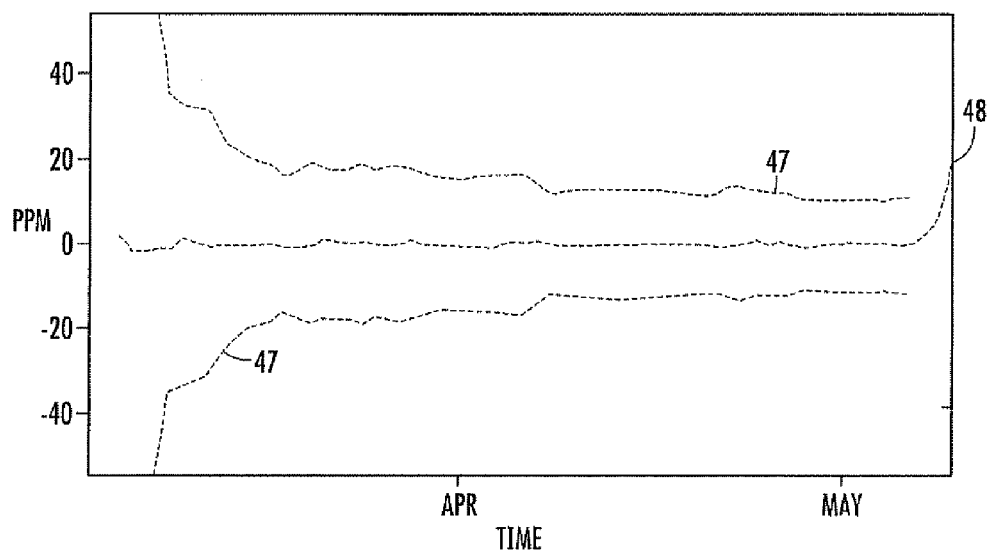
FIG. 6 is graph of simulated frequency error and a prediction interval in accordance with an exemplary aspect.

Initialization of the AFC aging algorithm will now be described. The initialization of the AFC aging algorithm occurs until 20 successful acquisition attempts have been observed. During this time, the frequency error estimation equation is less precise as it is operating over fewer data points. This is reflected in the graph of FIG. 6, which is a time-series plot of the first 50 acquisitions observed by a single iteration of the simulated algorithm and illustrates the frequency error 48. The prediction interval 47 illustratively gradually narrows over time.

The narrowing of the prediction interval 47 is achieved by way of the t-distribution parameter in the equation:

$$INTERVAL = +/- t(N-3) * stddev(Y) * sqrt(1 + B'((X'X)^{-1} B)$$

which will be described in further detail below. The more sample points that are available (and the smaller the variance of those points), the narrower the prediction interval 48. Given that the algorithm is designed to initiate a safe acquisition in the event that the prediction interval exceeds a given tolerance threshold (e.g. ±230 PPM), during initialization, the algorithm would generally employ a few (e.g. ~4-5) safe acquisitions before there were a sufficient number of data points with a relatively small variance for the prediction interval to fit inside the tolerance band. This may be unacceptable from a performance perspective as it would be the first exposure a new user has to the electronic device 20 and may be noticeably slower than the prior approaches.

To address this, upon the first successful acquisition the algorithm populates its list of sample points with 4 additional entries that match the parameters of the initial successful acquisition in all aspects except temperature. The 4 additional points' temperature value is changed by ±2 degrees Celsius with the goal of "seeding" the algorithm with the results of the first successful acquisition. This method may be relatively uncertain in that it hinges on both the first acquisition being representative (i.e. not influenced by a significant Doppler shift) and the temperature response of the VCO 31 being fairly small relative to the tolerance of the scanning algorithm. Further, as mentioned previously, acceptable samples of the form (temperature, age, frequency error) may be recorded during manufacturing of the device and may be re-purposed to serve as seed values, for example.

A more sophisticated approach samples the frequency error during an active DPCH as the internal temperature of the electronic device 20 is likely to increase from ~32° C. to ~55° C., for example, thus providing increased coverage of the most relevant temperature band. The algorithm could then, relatively slowly, replace the sample points with the results of successful acquisitions, thus providing the ability to interpolate/extrapolate in both the time and temperature predictor domains. Another consideration may be the incorporation of a velocity estimation indicator which could reduce the influence of Doppler-shift during the initialization phase, for example. Other or additional approaches may be used, as will be appreciated by those skilled in the art.

During normal operation, the controller 35 will typically use 20 sample points for fitting the frequency error estimation equation. The variance (and distribution) of these sample points determines the size of the prediction interval, which in turn determines whether a safe acquisition is performed. Once in the normal operation state, the algorithm typically does not leave the normal operation state.

Prior approaches indicate that there may be the possibility that the slope of either the temperature or age frequency response relationship could change direction multiple times during the lifetime of a VCO. Such an occurrence may be increasingly difficult for the algorithm executed by the controller 35 to accommodate, as the reversal of slope may interact with an extrapolation, which would result in the largest possible frequency error being observed upon the next acquisition attempt.

To address this, the tolerance band of ±6000 Hz may not used to determine if a safe acquisition should occur. Instead, a function of the tolerance band which compensates for the error associated with a slope inversion is used. Statistically this may be expressed as the union of two prediction intervals for two models of the relationship between age, temperature, and frequency error, with the only difference being that one of the models has the opposite temperature response coefficient estimate.

Figure 7:
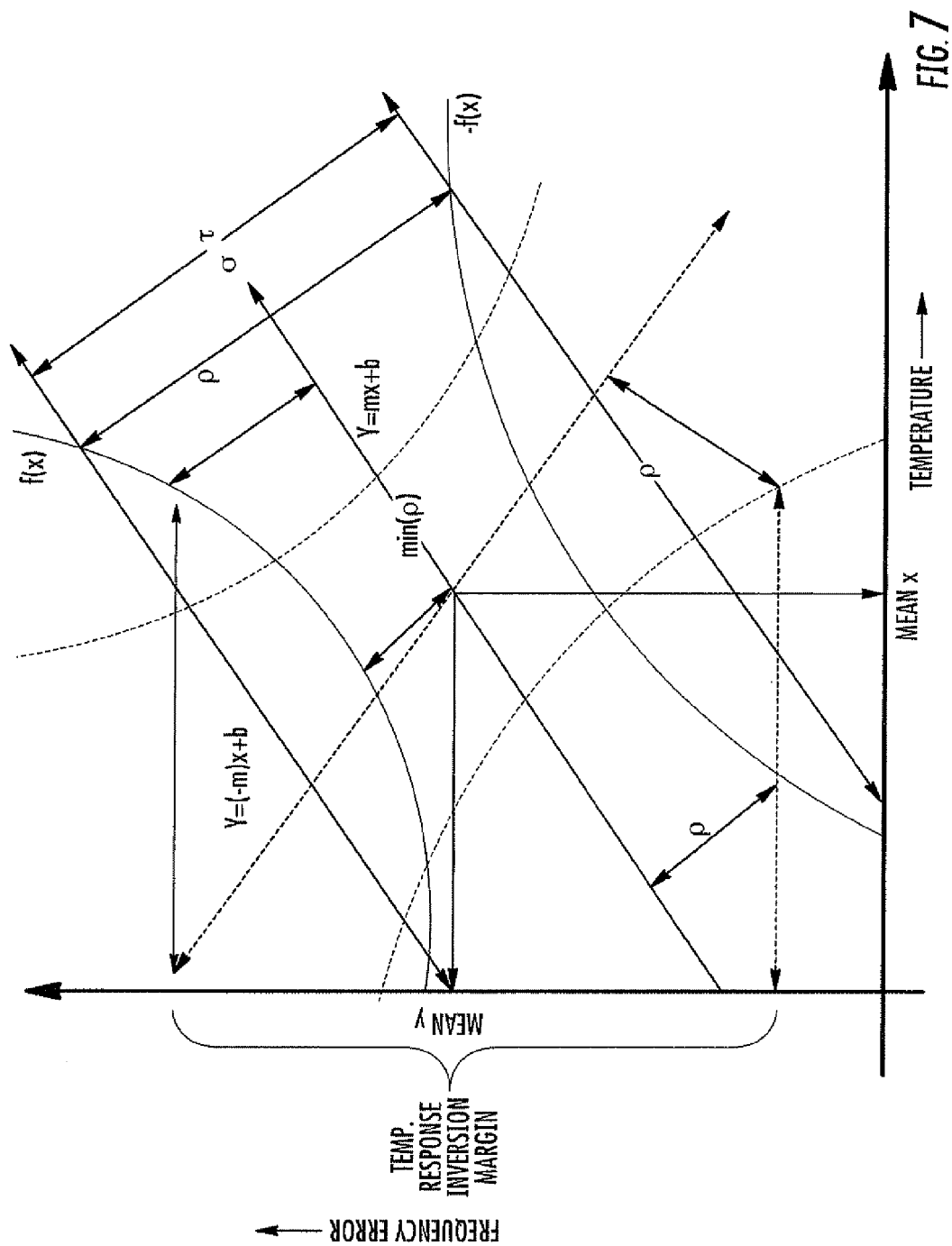
FIG. 7 is a graph of relationship of algorithm elements and quantities in accordance with an exemplary aspect.

The relationship of algorithm elements and quantities is illustrated in the graph in FIG. 7. Referred to as the temperature response inversion margin in the graph in FIG. 7, the augmented tolerance band is an interval that upholds the $1 \times 10^{-6}$ probability of acquisition failure while also factoring in the possibility that the fitted plane is completely inverted about the x-axis (y=(-m)x+b in the graph of FIG. 7). Given that the prediction interval is symmetric and convex about the mean frequency error, and assuming a perfectly linear relationship between a given predictor and frequency error, the temperature response inversion margin is generally less than or equal to $+/-(2*(Mean\ x-x)*m+\rho)$.

A fast acquisition is attempted as long as the value of prediction interval residual ρ at a given temperature (and timestamp in the actual implementation) is less than τ/2. Thus, the temperature response margin is sufficiently large to accommodate both the error associated with extrapolation and the possibility of a slope inversion while also ensuring a fast acquisition will succeed with the desired probability. The downside to this is a reduction in the dynamic range of the algorithm, which may ultimately impacts performance.

Figure 8:
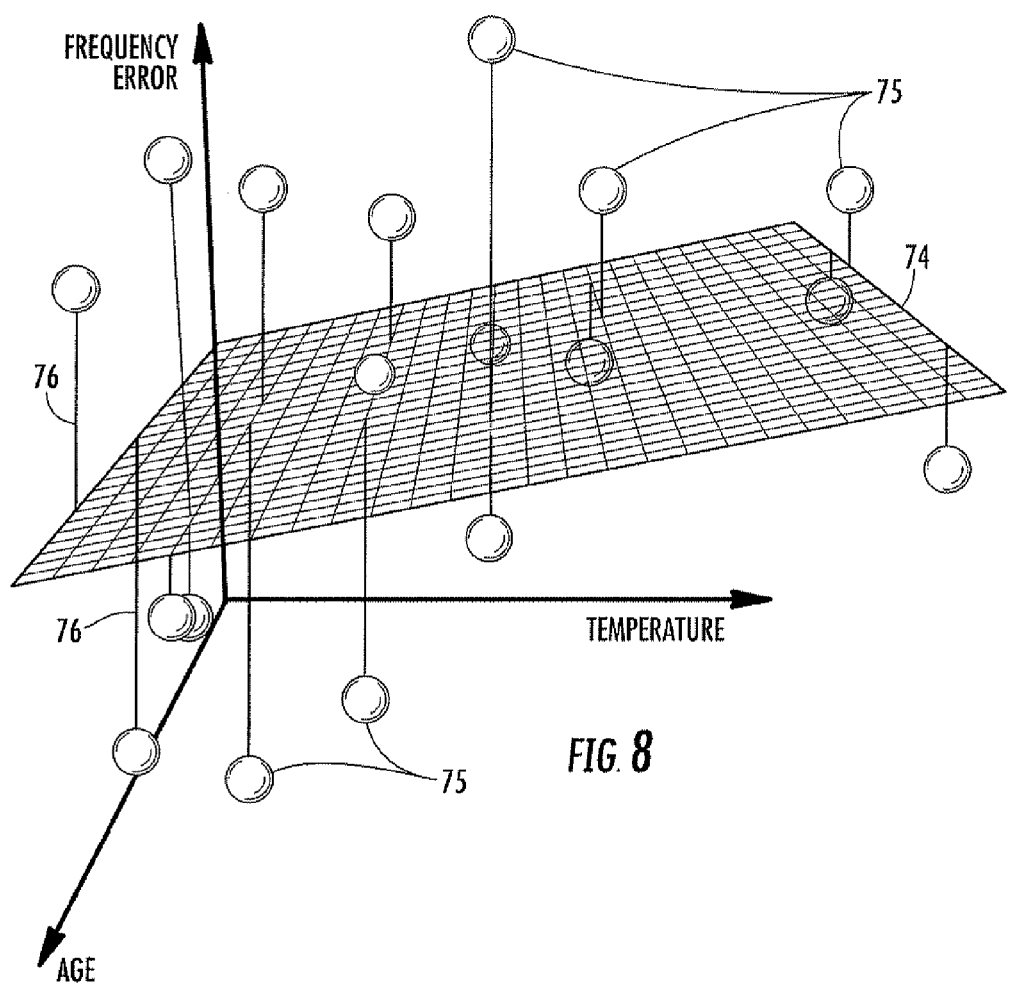
FIG. 8 is a graph of residuals between a fitted plane and observed data in accordance with an exemplary aspect.

Referring now additionally to the graph in FIG. 8. The mathematical aspects of the functions, and more particularly, the mathematical aspect of the algorithm, implemented by the controller 35 will now be described. The controller 35 relies on linear least squares estimation to estimate the coefficients of the frequency error estimation equation:

$$Y = B0 - B1 * X1 + B2 * X2 \quad (1.0)$$

where,
Y=a vector of length <=N of frequency errors
X=a matrix of row dimension n<=N with columns corresponding to temperature and time, and
B=a vector of length <=N of coefficients Linear least squares is used to solve for the vector B which reduces the sum of squared residuals 76, which are illustrated by the lines between the fitted plane 74 and the observed values 75 the graph of FIG. 8.

While B0 appears to have no corresponding column in the X matrix, this parameter is the intercept parameter. As the intercept parameter, it can typically only be estimated as a function of X and the residual values and is a column of "1's" in the X matrix. Algebraically, the vector of coefficients, B can be computed as follows:

$$Y = BX \quad (1.1)$$

$$X'Y = BX'X \quad (1.2)$$

$$((X'X)^{-1})(X'Y) = (X'X)^{-1})B(X'X) \quad (1.3)$$

$$B = ((X'X)^{-1})X'Y \quad (1.4)$$

It should be noted that the actual implementation used to derive B differs from that algebraic expression above. Computing the matrix inverse term $(X'X)^{-1}$ is increasingly expensive. The actual implementation leverages some properties of the matrix X'X (namely that it is symmetric and hermitian) to decompose the matrix into two lower triangle matrices L' and L, which have the property L'L=(X'X). Constructing the B vector can then be performed via back substitution with L and may reduce the relatively expensive matrix inversion operation.

With respect to the predication interval calculation, the prediction interval calculation utilizes the inverse covariance matrix $(X'X)^{-1}$ to compute a high and low bound for the frequency error estimate with a given temperature and time. The equation is as follows:

$$\text{INTERVAL} = +/- t(N-3) * \text{stddev}(Y) * \text{sqrt}(1 + B'((X'X)^{-1})B).$$

It should be noted that in order to compute a prediction interval that accommodates both the estimated coefficients (e.g. temperature and age) and their negative, a slightly modified version of the equation may be employed:

$$\text{INTERVAL} = +/- 2*(B*X - \text{MEAN}(Y)) + t(N-3) * \text{stddev}(Y) * \text{sqrt}(1 + B'((X'X)^{-1})B).$$

The new term introduced into the equation 2*(B*X-MEAN(Y)) captures the delta between the predicted frequency error at a given age/temperature and the mean frequency error. Visually this quantity can be thought of as the delta between the frequency error coordinate of the centroid of the 3 dimensional paraboloid in FIG. 5 and the frequency error coordinate corresponding to an arbitrary age/temperature pair as predicted by the linear model described in equation 1.0. Given that the model employed is linear, and therefore symmetric about the mean (i.e. the centroid of the paraboloid in FIG. 5), when multiplied by 2 this quantity represents the delta in predicted frequency error for a given age/temperature pair in the event that the estimated coefficients for temperature and age were inverted. The delta can be used to adjust the prediction interval to accommodate the scenario where the physical characteristics of the VCO suddenly change and are now orthogonal to the estimates in the model. In so doing, even in the event of a symmetric inversion of VCO characteristics, the stated probability of failing to estimate the range of predicted frequency error for a given age/temperature of $1 \times 10^{-6}$ is maintained.

The stddev(Y) function returns the standard deviation of Y (frequency error). This value directly influences the size of the prediction interval relative to the variation within predicted frequency errors. As the algorithm operates, if the frequency errors are highly variable, the controller 35 will be increasingly likely to employ a safe acquisition. Similarly, the term $(X'X)^{-1}$ (inverse covariance matrix) influences the size/shape of prediction region depending upon the relationship between temperature and time as predictors of frequency error. If there is a significant variance variation observed in terms of the predictors, like the scenario above with respect to the standard deviation of the frequency error, the likelihood of a safe acquisition being performed will increase in proportion to the amount of variability. This relationship can be seen in the graph of FIG. 9, where a simplified model (omitting age as a predictor of frequency error) has been plotted with respect to both confidence and prediction intervals 77, 78. Observed data values are indicated by 81 and the fit frequency error is indicated by 82.

Figure 9:
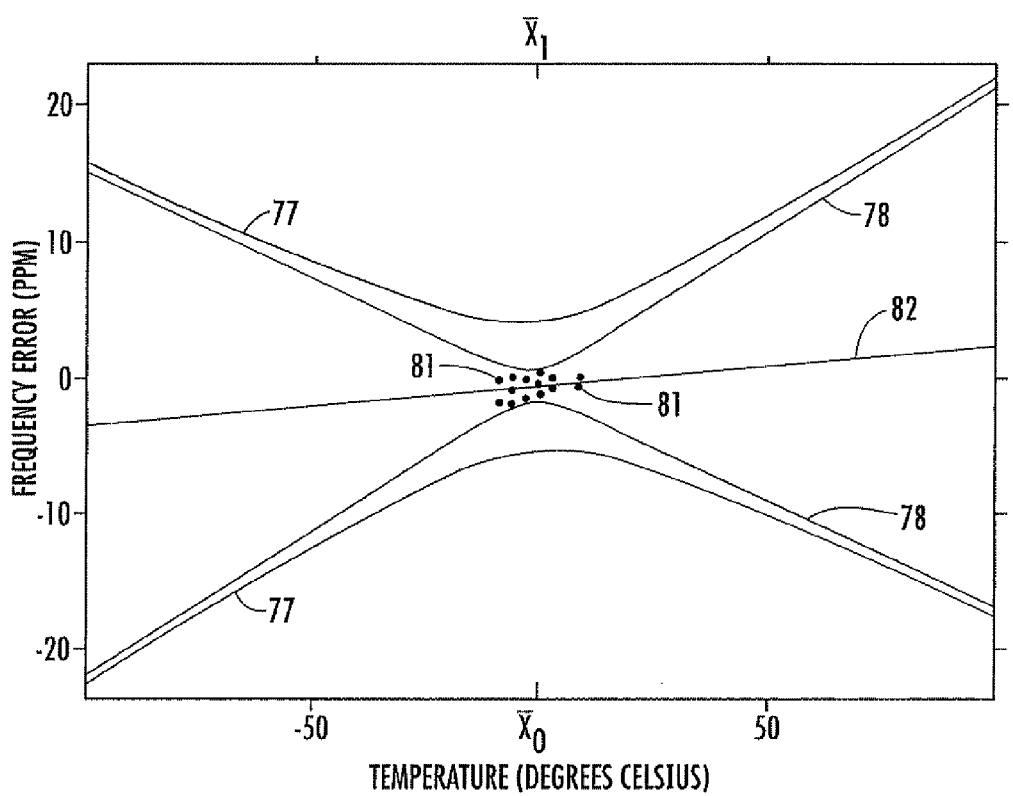
FIG. 9 is a graph of confidence and prediction intervals for a simplified model in accordance with an exemplary aspect.

It may be important to note that, as illustrated in the graph of FIG. 9, the prediction interval 77 is typically wider than the confidence interval 78. This difference is expressed in equation 1.5 as the additional 1 added to the term $B'((X'X)^{-1})B$ under the square root. This additional constant signifies increased variability associated with the prediction of an unobserved frequency error value, whereas the confidence interval is concerned with providing a bound for frequency error at an observed temperature. The justification for addition of 1 can be thought of as accounting for the increased variance that comes from predicting both the confidence interval for a given temperature as well as the probability of the temperature value itself being observed.

The graph of FIG. 9 also provides a reasonably good representation of the magnitude of the error margin before a safe acquisition is employed. When the distance between the prediction interval curves 77 exceeds 560 PPM (+/−230 PPM or +/−6000 Hz@26 Mhz), a safe acquisition could occur. Computation of the $B'((X'X)^{-1})B$ term alone is computationally intractable as the matrix multiplication operation typically requires $2n^3$ operations to multiply 2n×n matrices.

As such, it may not be acceptable to evaluate equation (1.5) during an acquisition. In that case, an approximation may be desired.

Options for approximating the prediction interval will now be described. To reduce the possible latency involved in evaluating the prediction interval equation prior to each acquisition, one option is to compute an approximation of the curves 77, 78 in the graph of FIG. 9. The difficulty may lie with the fact that the prediction interval calculation is a function of two variables and given that it is ultimately involved in the decision as to whether to attempt a fast acquisition, its accuracy may be increasingly important.

The line 77 in the graph in FIG. 9 is a parabola in 2-dimensions and a paraboloid in 3-dimensions. Elliptical paraboloids can be represented by the 2nd order polynomial equation:

$$z=f(x,y)=A x^2+B^*x^*y+C^*y^2+D^*x+E^*y+F \quad (1.7)$$

It may be possible to determine the parameters A-F via least-squares estimation in much the same way as equations 1.6 and 1.0 described above. To accomplish this, equation 1.5 would be evaluated at 6 points (x,y) and the 6 result tuples of (z,x,y) used to solve for A-F in equation 1.7.

One advantage of this approach is that it is a representation of the prediction interval equation which only includes 8 multiplications and 5 additions to evaluate during acquisition. However, it is typically increasingly expensive to compute a priori at least without a relatively sophisticated algorithm. The advantage, however, is that such relatively expensive operations would typically occur in a low-priority thread and not at acquisition time thus reducing the real-time performance implications.

The controller 35 may implement the above-noted functions, or algorithm, with the following data structures, as will be appreciated by those skilled in the art. The algorithm will generally include the sample points in a structure similar to the following:

```
Typedef struct {
    WORD AfcDac;
    WORD Temp;
    WORD Age;
} samplePoint;
Typedef struct {
    WORD intercept;
    WORD tempCo;
    WORD ageCo;
} estEquation;
Typedef struct {
    WORD afcDacMean
    WORD afcDacStdDev;
    WORD scalingFactor[3];
    estEquation coefficients;
    BYTE numSamples;
    samplePoint samples[3][20];
    WORD inverseCovarianceMatrix[9];
} table;
```

The following table is defined to represent the t-distribution with N<30 degrees of freedom:

```
const double tDist[ ] = {
318309.886174, 707.105721, 103.299468, 41.577854,
24.771030, 17.830315,
14.241470, 12.109835, 10.720160, 9.751995, 9.043276,
8.504303,
8.081844, 7.742509, 7.464385, 7.232543, 7.036487,
6.868638,
6.723394, 6.596530, 6.484802, 6.385682, 6.297169,
6.217662,
6.145865, 6.080716, 6.021340, 5.967007, 5.917106,
5.871117
};
```

Interfaces and resources, and in particular, external interfaces will now be described. The AFC aging algorithm employed by the controller 35 may use same application programming interface (API) as used by the prior algorithms. The function prototypes below represent the functions to be implemented differently by the controller 35 in executing the present algorithm. This is typically achieved by conditional compilation of function implementations depending upon a build flag (e.g. #define USE_NEW_AFC_AGING).

```
void DetTempUpdate(aplp_event event, VOID_PTR msg)
static UINT16 GetAfcDacFromTable(int temp)
CheckAfcDacCentralValue( UINT16 oldAfcDac, UINT16
newAfcDac )
void SetCalibAfcCentralVal(void)
void FillInitialAfcDacValTable(void)
BOOL IsAfcTimestampValid(calanderMonthYear_ts
timeStamp)
BOOL AfcDacTableFileCreate( )
void AfcDacTableCheckUpdate(int indx)
void UpdateAfcTable(int temp, UINT16 AfcDacVal)
void ResetAfcDacTable (UINT16 *dummy)
```

As an example of the nature of the replacement procedure, consider the function, "GetAfcDacFromTable(int temp)"—this function normally uses the supplied parameter(temp) to lookup a corresponding index in a table and retrieve an AFC-DAC value. Internally, the table also stores an AGE parameter with each AFCDAC value. When "GetAfcDacFromTable( )" is called, if the AGE value was determined to be acceptable for a given index, the AFCDAC value was returned. If the temperature index corresponding to the 'temp' parameter did not include a valid AFCDAC value or the AGE value was determined to be unacceptable, as will be appreciated by those skilled in the art, an error indication is returned. The error indication may ultimately result in a safe acquisition attempt.

To accommodate the algorithm executed by the controller 35, when "GetAfcDacFromTable( )" is called the prediction interval estimation equation will be first evaluated and if the resulting interval is within tolerance, the frequency error estimation equation will be evaluated with the supplied 'temp' parameter and the current UTC time (scaled appropriately to the same units as recorded in the table). The result of which is returned. It should be noted that although the UTC time is a parameter of the frequency estimation equation (similar to 'temp', for example), it is not supplied via the function's arguments. Instead it is either queried as needed via a call to another function, for example, GetUTCTime( ) function, or it will be queried once and stored in a global variable which can be referenced whenever as needed.

Figure 10:
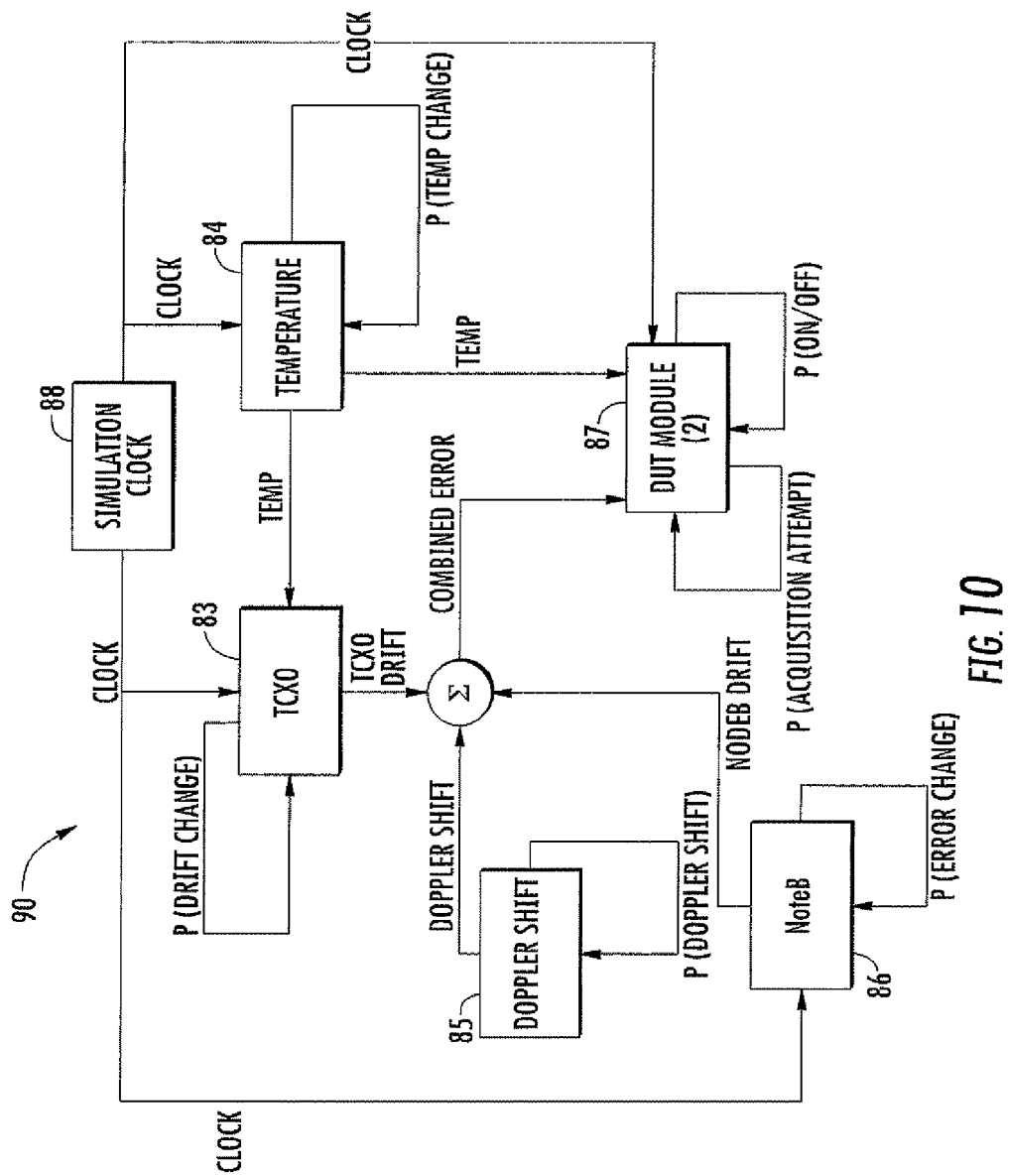
FIG. 10 is a schematic diagram of simulation architecture in accordance with an exemplary aspect.

Referring now to FIG. 10, simulation architecture 90 is described. A discrete event simulation was used to evaluate the performance of the algorithm executed by the controller 35 versus prior approaches.

The simulation architecture includes five main components: TCXO (i.e, VCO) 83, temperature 84, Doppler shift 85, NodeB 86 and DUT 86 modules. A connection between components indicates the existence of real-valued signals which are active for only one duty cycle of the simulation clock 88. As an example, the TCXO module 83 can receive real—valued signals from the temperature module 84 at each clock cycle. However, in the actual simulation the frequency at which the temperature module 84 will generate signals on the TEMP arc lower as the clock resolution is in seconds and the granularity of temperature variation within the temperature module is on the order of hours. The arcs exiting and entering each module labeled with the "P( . . . )" notation indicate changes of state which may occur asynchronously inside each module independent of all other events in the system.

Such arcs are conceptually similar to the generation of real-valued signals between modules, except they terminate at the same module of origin. As an example, "P(DOPPLER SHIFT)" is a discrete event which may occur inside the Doppler shift module 85, which incidentally changes the state of the module to start generating a corresponding frequency error to simulate the effects of Doppler shift. This value is then combined with other sources of error from the TCXO module 83 and NodeB module 86 to form the actual frequency error, which the DUT module 87 compensates for if P(ACQUISITION ATTEMPT) occurs.

In addition to the discrete events displayed noted above, there are other simulation parameters which typically introduce additional variability into the generated real-valued signals. Often, the computation of a given real-valued signal is a function of state variables of the given module.

As an example, the "TCXO DRIFT" of the TCXO module 83 is a function of the current temperature and clock value and may be affected by a polarity multiplier that is modified by the "DRIFT CHANGE" event. Table 1 below lists the parameters of the simulation.

TABLE 1

| Module | Parameter | Value Range |
| --- | --- | --- |
| Temperature | WARM_MEAN | 0 C. |
| | WARM_STD_DEV | 1 C. |
| | SEASONAL_OFFSET_MEAN | 8 C. |
| | SEASONAL_OFFSET_STD | 3 C. |
| | COLD_MEAN | −10 C. |
| | COLD_STD_DEV | 1 C. |
| DUT | DEVICE_OFF_PROLONGED_MEAN_DUR | 3 Months |
| | DEVICE_OFF_PROLONGED_STDDEV_DUR_SEC | 3 Months |
| | DEVICE_OFF_PROLONGED_PROB | .05/DAY |
| | ACQUISITION_PROB | .9/DAY |
| NodeB | NODEB_MEAN_DRIFT | 0 PPM |
| | NODEB_STD_DEV_DRIFT | 0.1 PPM |
| Doppler | DOPPLER_PROB | 0.10/DAY |
| | DOPPLER_MEAN_DURATION | 1 HOUR |
| | DOPPLER_STD_DEV_DURATION | 2 HOURS |
| TCXO | CRYSTAL_DRIFT_NOISE_STD_DEV | 0.5 PPM |
| | CRYSTAL_DRIFT_NOISE_MEAN | 0 PPM |
| | TEMP_COEFFICIENT_MEAN | 0.025 PPM/DEGREE |
| | TEMP_COEFFICIENT_STD | 0.025 PPM/DEGREE |
| | AGE_COEFFICIENT_STD | 0.25 PPM/DAY |
| | AGE_COEFFICIENT_MEAN | 0.25 PPM/DAY |
| | AGE_DRIFT_DIR_PROB | 0.9/DAY |
| | TEMP_DRIFT_DIR_PROB | 0.9/DAY |
| | INTERCEPT_COEFFICIENT_MEAN | 0 PPM |
| | INTERCEPT_COEFFICIENT_STD | 0.1 PPM |

For the purposes of simulation, the drift model employed to simulate VCO (TOXO) frequency error takes the form:

$$DRIFT=POLARITY*(INTERCEPT+TEMP\_COEFFICIENT*TEMP+AGE\_COEFFICIENT*AGE)+RANDOM\_NOISE$$

The parameters TEMP_COEFFICIENT and AGE_COEFFICIENT are chosen randomly according to the parameters in Table 1, above, and remain constant throughout a single simulation iteration. The POLARITY parameter however can change during the simulation, according to the probability specified in Table 1, above. The RANDOM_NOISE parameter is Gaussian distributed according to the parameters in Table 1.

Figure 11:
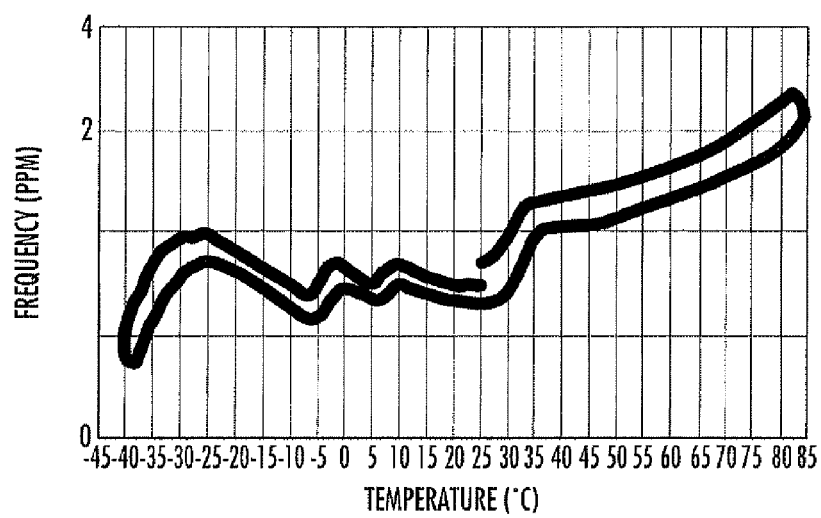
FIG. 11 is a graph of a temperature controlled VCO exhibiting hysteresis and non-linearity in accordance with the prior art.

For further improvement, it may be desirable to introduce a drift model which is slightly more realistic than the linear model described above. This may include a logarithmic decay in drift due to age and a non-linear relationship between temperature and frequency error response. The noise factor may also be more suitably parameterized to better reflect realistic noise values. One omission from the model is a hysteresis coefficient, which quantifies the expected difference in frequency error depending upon the temperature delta (i.e. cooling or warming). The graph in FIG. 11 of a temperature controlled VCO exhibiting hysteresis and non-linearity demonstrates this phenomena.

Figure 12:
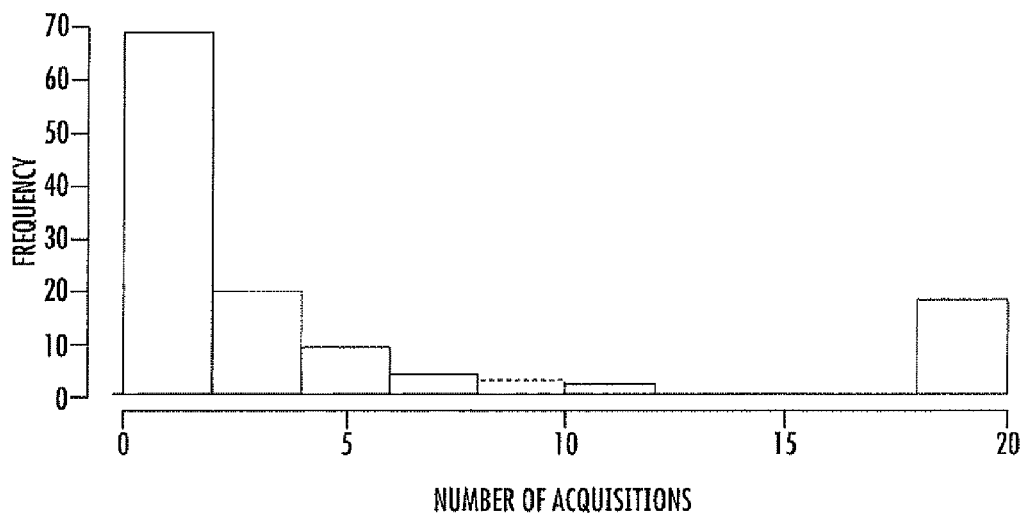
FIG. 12 is a graph of a number of acquisitions per 24-hour period in accordance with an exemplary aspect.

With respect to model parameter verification, preliminary field data has been gathered to determine the adequacy of the parameter values defined in Table 1, above. A sample size of 145 device days was used to generate the plots and statistics pertaining to model parameter verification. The graph in FIG. 12 illustrates the number of acquisitions per 24-hour period.

The number of acquisitions attempts per day is significantly different than that employed in the model (as described in Table 1). It appears a heavy-tailed distribution is more appropriate than the current model which generates an acquisition attempt 1/day with a probability of 0.90. Given the shape of the distribution, caution should be taken when interpreting the concentration of around 20 acquisitions per day—this may be due to atypical behavior due to developer debugging/testing, for example.

Figure 13A:
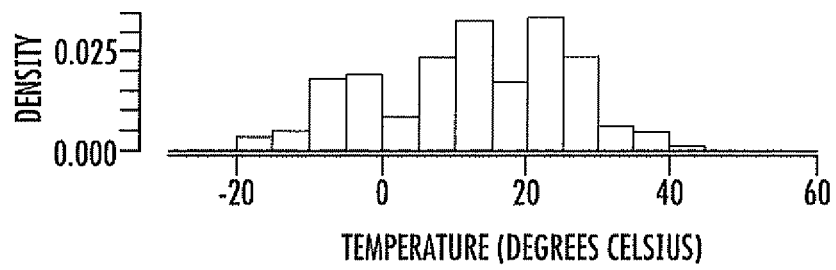
FIG. 13a is a graph of acquisition temperature distribution in accordance with an exemplary aspect.
Figure 13B:
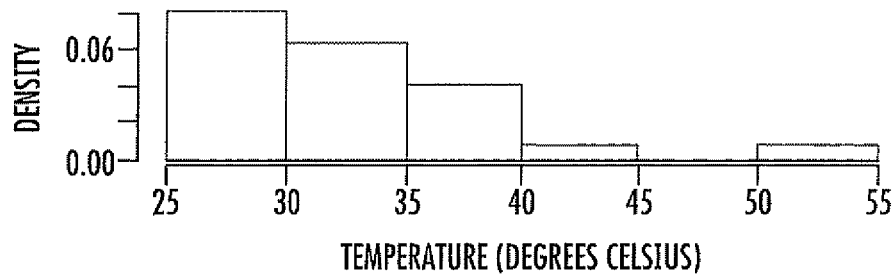
FIG. 13b is another graph of acquisition temperature distribution in accordance with an exemplary aspect.

Assessment of the temperature parameter reveals that a Gaussian model centered around 32 degrees Celsius with standard deviation of 5 degrees may be more appropriate. The distribution using simulated data is illustrated in the graph in FIG. 13a. It is worthwhile noting that the field data, illustrated in the graph in FIG. 13b, was taken during the month of July, a generally warmer month, exclusively whereas the simulation data was sampled over the course of an entire year using a temperature model with a seasonal component.

Figure 14A:
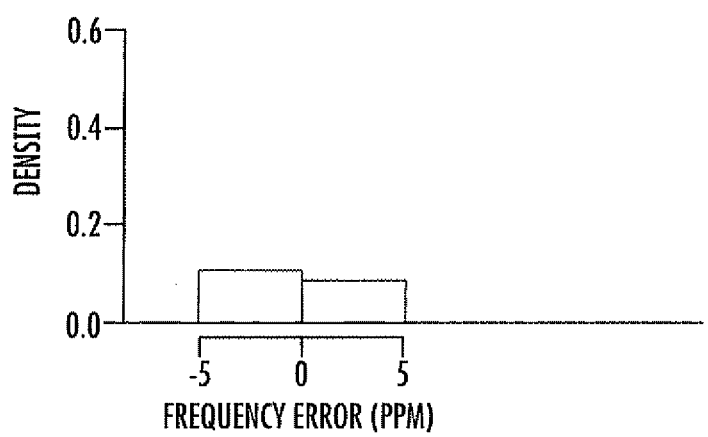
FIG. 14a is a graph of a frequency error distribution according to an exemplary aspect.
Figure 14B:
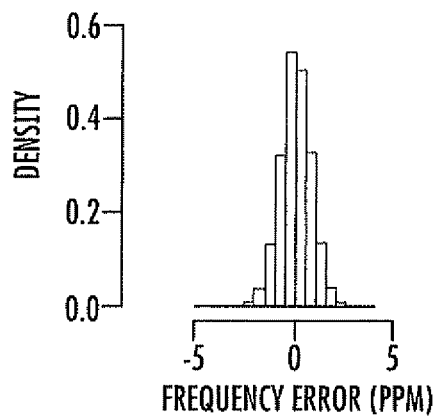
FIG. 14b is a graph of a frequency error distribution according to the prior art.
Figure 14C:
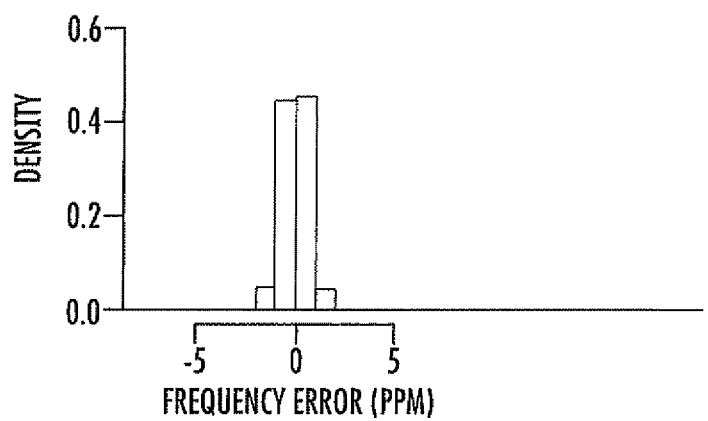
FIG. 14c a graph of a frequency error distribution according to another exemplary aspect.

Referring now to the graphs in FIGS. 14a-14c, a comparison of the frequency error distribution between preliminary data from the field source (FIG. 14a), simulation results according to the prior art (FIG. 14b), and simulation results the according to the present embodiments (FIG. 14c) is illustrated. Indeed, there is sufficient statistical evidence to conclude that the distribution of frequency errors is different ($p \ll 0.0001$) between each source.

Figure 15:
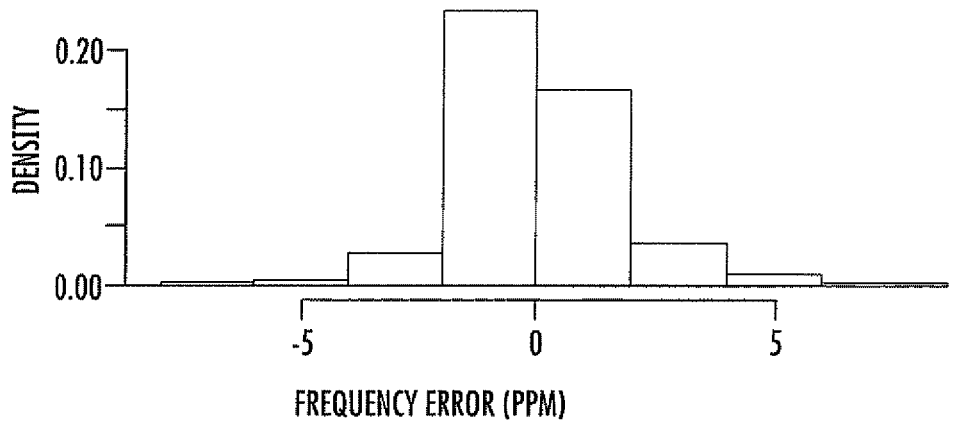

Referring now to the graph in FIG. 15, a more detailed plot of the frequency error from the field source has been rescaled to better show the shape. Ideally, the parameters of the simulation would be adjusted until this discrepancy is greatly reduced or disappears.

With the simulation parameters as defined in Table 1, the controller 35, provides improved performance as compared to prior approaches in both the accuracy of the frequency error estimates and the number of safe acquisitions employed. The controller 35 implementing the algorithm described herein is typically 15-17% more accurate in terms of frequency error estimation and utilizes far fewer safe acquisitions, typically on the order of 0.1%.

Figure 16A:
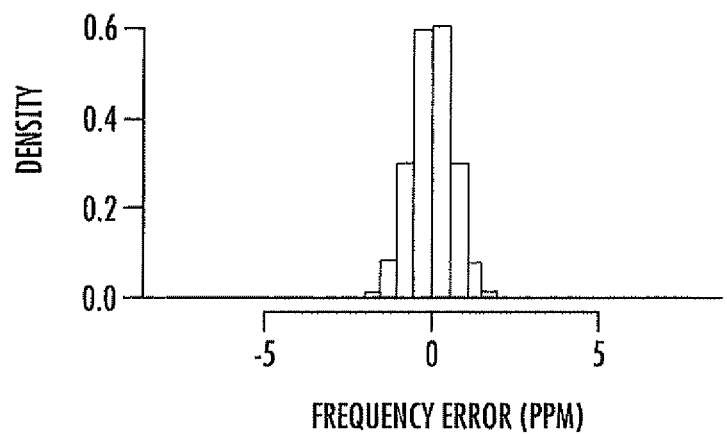
FIG. 16a is a graph of a frequency error estimate distribution according to an exemplary aspect.
Figure 16B:
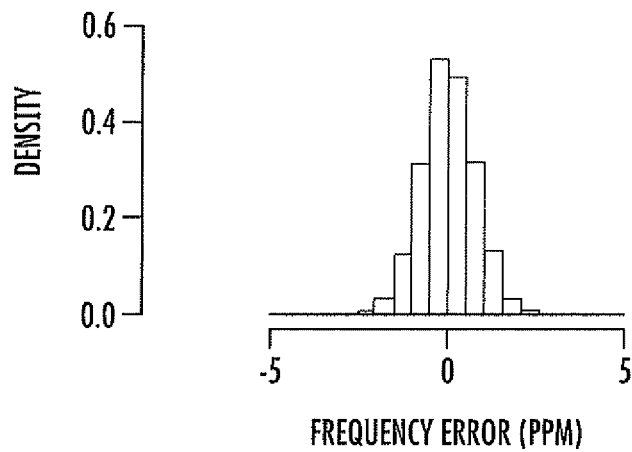
FIG. 16b is a graph of a frequency error estimate distribution according to the prior art.

Referring to the graphs in FIGS. 16a and 16b, a comparison of the two frequency error estimate distributions according to the present embodiments (FIG. 16a) and prior approaches (FIG. 16b) are illustrated. Five-hundred simulated years of mobile activity were used to generate the results.

However, it should be noted that the results illustrated in FIGS. 16a and 16b may be interpreted with particular interest for the following reasons:
1) The crystal drift model used in the simulation may be overly simplistic. As such, it may not be surprising that the linear model employed by the new algorithm is able to achieve more accurate estimates as the two models increasingly similar, differing by coefficient parameters. Thus, the algorithm implemented by the controller 35 in accordance with the present embodiments may have an inherent advantage over the prior approaches which make no assumptions of the underlying drift model.
2) As noted above, it may desirable that the model parameters need further justification with respect to field data. The perceived superiority of the algorithm implemented by the controller 35 may be entirely related to the simulation parameterization and real-world performance may be different, for example.

Figure 17:
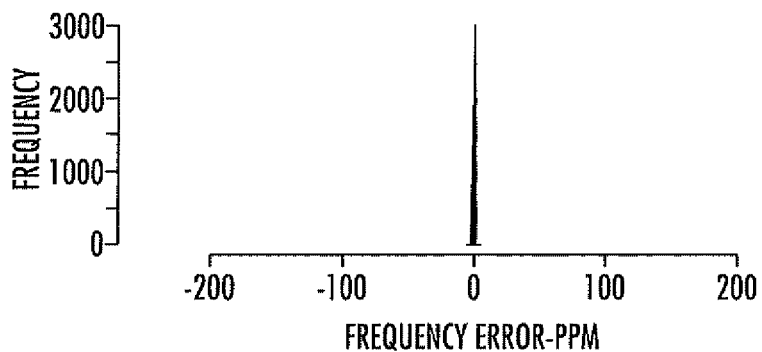
FIG. 17 is a graph of a distribution of frequency error estimates with respect to the tolerance band in accordance with the prior art.

In general, with respect to the data presented above, the parameterization (i.e. 3 month viability window for table entries) of the prior approaches appears overly conservative. Given the parameters defined in Table 1 (of which, the relevant parameters for the TOM module 41 are larger than those listed in prior approaches), the mean frequency error is ~0.58 PPM with a standard deviation of ~0.45 PPM. With a tolerance of +/−6000 Hz (+/−230 PPM) the probability of an acquisition failing is relatively small, $p \ll 1*10^{-6}$. This may be seen illustrated by comparing FIGS. 16a and 16b to the graph in FIG. 17, which is a distribution of frequency error estimates with respect to the tolerance band (±230 PPM) according to prior approaches, where the different x-axis scales show the magnitude of error margin that the prior approaches fail to exploit.

To determine how the controller 35 would react to different VCO parameters, all VCO related parameters in Table 1 were evaluated at 10, 20, and 30 times their original value. 10 iterations of 5 years in duration were used to evaluate the algorithms at each scaling factor. As an example, a scaling factor of 20 results in AGE_COEFFICIENT_STD changing from 0.25 PPM/DAY to 5 PPM/DAY.

Figure 18A:
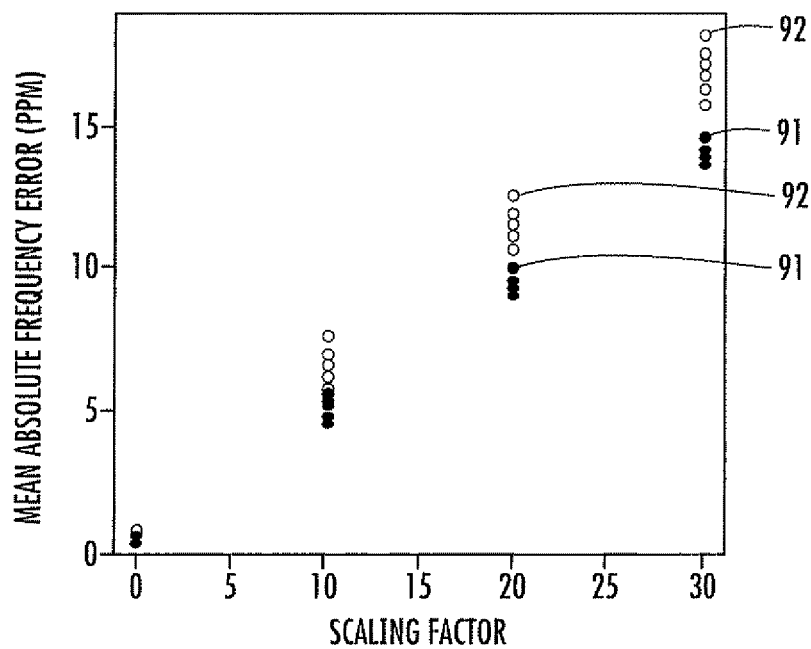
FIG. 18a is a graph comparing the mean absolute frequency error.
Figure 18B:
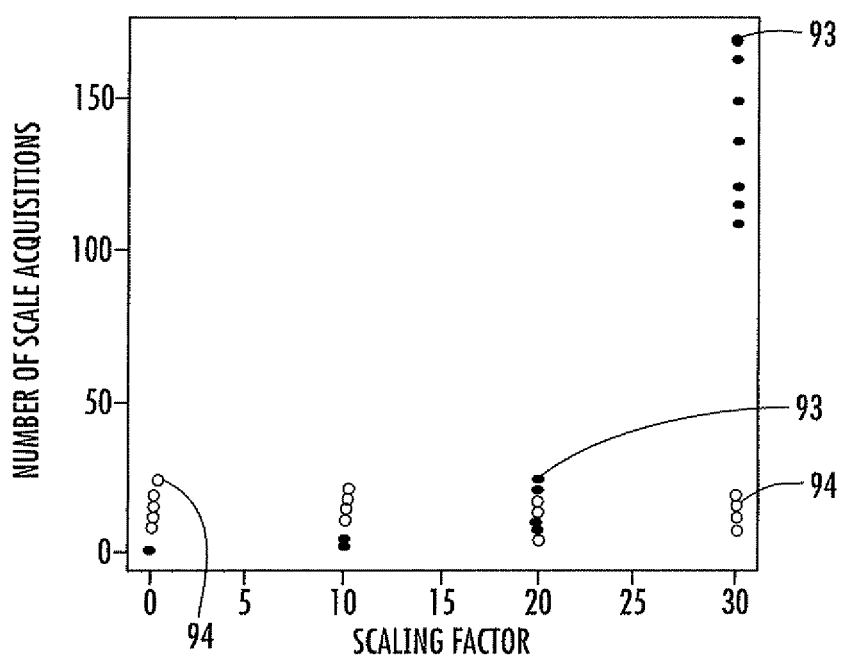
FIG. 18b is a graph comparing the number of safe acquisitions performed.

As described in Table 2, below, in terms of mean absolute frequency error, the results of the controller 35 executing the algorithm scale marginally better than the prior approaches until the scaling factor reaches 20. At this point, the variance and magnitude of temperature/age response is increasingly large as to cause a sharp rise in safe acquisitions. This is illustrated in the graphs of FIGS. 18a and 18b. The mean absolute frequency error using the algorithm of the present embodiments 91 and using the algorithm of prior approaches 92 is illustrated in the graph in FIG. 18a. The graph in FIG. 18b illustrates the number of safe acquisitions for both the algorithm of the present embodiments 93 and the algorithm of prior approaches 94. The algorithms executed the controller 35 and the prior approaches exhibit a near-linear scaling in terms of mean absolute frequency error across all scale factors.

TABLE 2

| Scaling Factor | Algorithm | Mean Abs. Frequency Error (PPM) | Mean Number of Safe Acquisitions |
|---|---|---|---|
| 0 | Present Embodiments | 0.461 | 1 |
|  | Prior Approach | 0.55 | 15.4 |
| 10 | Present Embodiments | 4.82 | 2.77 |
|  | Prior Approach | 5.89 | 15.00 |
| 20 | Present Embodiments | 9.48 | 13.22 |
|  | Prior Approach | 11.52 | 13.77 |
| 30 | Present Embodiments | 14.51 | 138.67 |
|  | Prior Approach | 16.95 | 14.66 |

Quite surprisingly, the number of failed acquisitions for the both the present embodiments and the prior approaches remain at 0 even at a scaling factor of 30. The point at which the prior approaches begin to breakdown may not be entirely known, but it would likely be related to the 3-month period used to assess the reliability of table entries or potential drift per degree Celsius with respect to the real-world counterparts to the parameters in Table 1 after being scaled by a sufficiently high value, for example.

In summary, the functions or algorithm performed by the controller 35 can be seen as more accurate up until a certain threshold whereby the temperature response inversion error margin begins to be exceeded. This may cause the controller 35 to initiate an excessive number of safe acquisitions, whereas the prior approaches would reference the table entry (provided it was <3 months old) that was last used within +/−15 degrees of the acquisition temperature. The prior approaches essentially trade accuracy for efficiency in this circumstance.

Provided the expected frequency error over a 15 degree window does not exceed the tolerance band (taking into consideration variance and Doppler-shift etc.), this approach should behave properly. Once the scale factor threshold is breached, the performance deteriorates rapidly; however, the probability of a failed acquisition remains at the desired $1 \times 10^{-6}$.

The data vectors used to generate plots/figures herein are as follows:

```
age<-c(40.957161, 41.082789, 41.225646,
41.368504, 41.654218, 41.797075, 42.115812,
42.225646, 42.368504, 42.529646, 42.654218,
42.797075, 39.797075, 39.939932, 40.082789,
40.264392, 40.368504, 40.511361, 40.654218,
```

```
40.797075)
temp<-c(-6.000000, 0.000000, -9.000000,
-3.000000, -6.000000, -3.000000, -9.000000,
9.000000, 0.000000, -6.000000, -6.000000,
-6.000000, 3.000000, -3.000000, -3.000000,
0.000000, -3.000000, 3.000000, 9.000000,
9.000000)
ferror<-c(-0.046507, -1.205800, -1.818248,
-0.554621, -1.893009, -1.531104, -0.213150,
-0.687883, 0.439925, -1.007412, 0.161591,
-0.911239, -0.781589, -0.193969, 0.193969,
-0.619425, -0.152844, -0.061636, -0.432912,
-0.064353)
```

A method aspect is directed to a method of operating an electronic device 20 including a VCO 31 and a temperature sensor 32 coupled to the VCO. The method includes sensing a temperature using the temperature sensor. The method also includes determining a frequency error of the VCO for each of a plurality of most recent samples based upon the sensed temperature, each sample having a given age associated therewith. The method also includes aligning the temperature, the frequency error, and the given age for each of the plurality of most recent samples in a three-dimensional (3D) coordinate system having respective temperature, frequency error and age axes. The method also includes estimating the predicted frequency error of the VCO 31 based upon the aligned temperature, frequency error, and given age of the plurality of most recent samples. The method further includes controlling the VCO based upon the predicted frequency error.

It will be appreciated by those skilled in the art the references to an algorithm refer to the functions performed by the controller 35. Moreover, with respect to the controller 35, the above-described modules are conceptual modules for ease of explanation, and may be implemented as part of the controller. The functions of the modules may be embodied within the controller 35, for example, or may be shared across multiple controllers for example.

It will be appreciated that any module or component exemplified herein that executes instructions, for example, the controller 35, may include or otherwise have access to computer readable media such as storage media, computer storage media, or data storage devices (removable and/or non-removable) such as, for example, magnetic disks, optical disks, or tape. Computer storage media may include volatile and non-volatile, removable and non-removable media implemented in any method or technology for storage of information, such as computer readable instructions, data structures, program modules, or other data. Examples of computer storage media include RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by an application, module, or both. Any such computer storage media may be part of the electronic device 35, etc., or accessible or connectable thereto. Any application or module herein described may be implemented using computer readable/executable instructions that may be stored or otherwise held by such computer readable media.

Exemplary components that may be used in various embodiments of the above-described electronic device are now described with reference to an exemplary mobile wireless communications device 1000 shown in FIG. 19. The device 1000 illustratively includes a housing 1200, a keypad 1400 and an output device 1600. The output device shown is a display 1600, which may comprise a full graphic LCD. In some embodiments, display 1600 may comprise a touch-sensitive input and output device. Other types of output devices may alternatively be utilized. A processing device 1800 is contained within the housing 1200 and is coupled between the keypad 1400 and the display 1600. The processing device 1800 controls the operation of the display 1600, as well as the overall operation of the mobile device 1000, in response to actuation of keys on the keypad 1400 by the user. In some embodiments, keypad 1400 may comprise a physical keypad or a virtual keypad (e.g., using a touch-sensitive interface) or both.

The housing 1200 may be elongated vertically, or may take on other sizes and shapes (including clamshell housing structures, for example). The keypad 1400 may include a mode selection key, or other hardware or software for switching between text entry and telephony entry.

Figure 19:
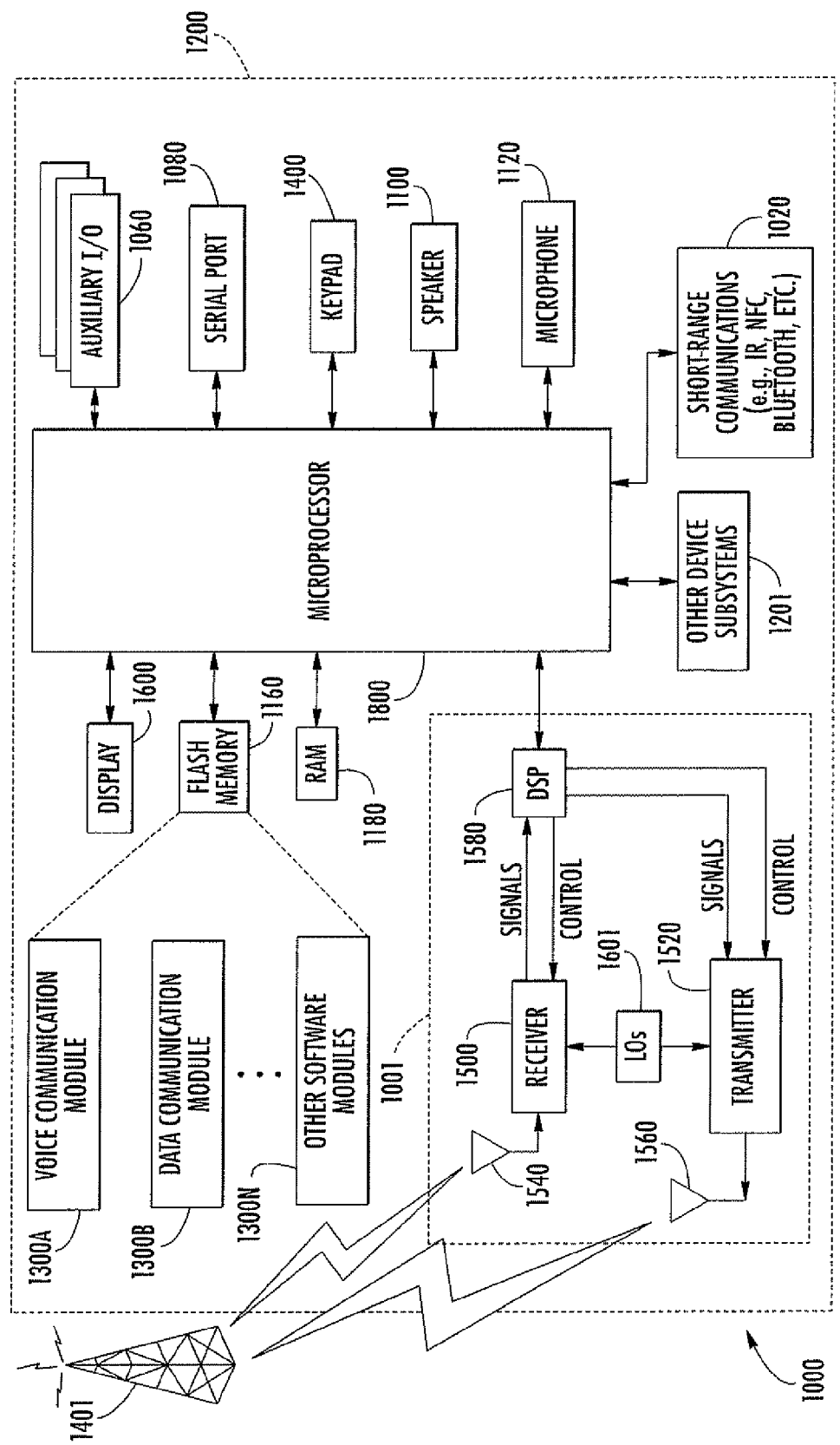
FIG. 19 is a schematic block diagram illustrating additional components that may be included in the electronic device of FIG. 1.

In addition to the processing device 1800, other parts of the mobile wireless communications device 1000 are shown schematically in FIG. 19. These include a communications subsystem 1001; a short-range communications subsystem 1020; the keypad 1400 and the display 1600, along with other input/output devices 1060, 1080, 1100 and 1120; as well as memory devices 1160, 1180 and various other device subsystems 1201. The mobile device 1000 may comprise a two-way RF communications device having voice and data communications capabilities. In addition, the mobile device 1000 may have the capability to communicate with other computer systems via the Internet.

Operating system software executed by the processing device 1800 may be stored in a persistent store, such as the flash memory 1160, but may be stored in other types of memory devices, such as a read only memory (ROM) or similar storage element. In addition, system software, specific device applications, or parts thereof, may be temporarily loaded into a volatile store, such as the random access memory (RAM) 1180. Communications signals received by the mobile device may also be stored in the RAM 1180.

The processing device 1800, in addition to its operating system functions, enables execution of software applications or modules 1300A-1300N on the device 1000, such as software modules for performing various steps or operations. A predetermined set of applications that control basic device operations, such as data and voice communications 1300A and 1300B, may be installed on the device 1000 during manufacture. In addition, a personal information manager (PIM) application may be installed during manufacture. The PIM may be capable of organizing and managing data items, such as e-mail, calendar events, voice mails, appointments, and task items. The PIM application may also be capable of sending and receiving data items via a wireless network 1401. The PIM data items may be seamlessly integrated, synchronized and updated via the wireless network 1401 with the device user's corresponding data items stored or associated with a host computer system.

Communication functions, including data and voice communications, are performed through the communications subsystem 1001, and possibly through the short-range communications subsystem. The communications subsystem 1001 includes a receiver 1500, a transmitter 1520, and one or more antennas 1540 and 1560. In addition, the communications subsystem 1001 also includes a processing module, such as a digital signal processor (DSP) 1580, and local oscillators (LOs) 1601. The specific design and implementation of the communications subsystem 1001 is dependent upon the communications network in which the mobile device 1000 is intended to operate. For example, a mobile device 1000 may include a communications subsystem 1001 designed to operate with the Mobitex™, Data TAC™ or General Packet Radio Service (GPRS) mobile data communications networks, and also designed to operate with any of a variety of voice communications networks, such as AMPS, TDMA, CDMA, WCDMA, PCS, GSM, EDGE, etc. Other types of data and voice networks, both separate and integrated, may also be utilized with the mobile device 1000. The mobile device 1000 may also be compliant with other communications standards such as GSM, 3G, UMTS, 4G, etc.

Network access requirements vary depending upon the type of communication system. For example, in the Mobitex and DataTAC networks, mobile devices are registered on the network using a unique personal identification number or PIN associated with each device. In GPRS networks, however, network access is associated with a subscriber or user of a device. A GPRS device therefore utilizes a subscriber identity module, commonly referred to as a SIM card, in order to operate on a GPRS network.

When required network registration or activation procedures have been completed, the mobile device 1000 may send and receive communications signals over the communication network 1401. Signals received from the communications network 1401 by the antenna 1540 are routed to the receiver 1500, which provides for signal amplification, frequency down conversion, filtering, channel selection, etc., and may also provide analog to digital conversion. Analog-to-digital conversion of the received signal allows the DSP 1580 to perform more complex communications functions, such as demodulation and decoding. In a similar manner, signals to be transmitted to the network 1401 are processed (e.g. modulated and encoded) by the DSP 1580 and are then provided to the transmitter 1520 for digital to analog conversion, frequency up conversion, filtering, amplification and transmission to the communication network 1401 (or networks) via the antenna 1560.

In addition to processing communications signals, the DSP 1580 provides for control of the receiver 1500 and the transmitter 1520. For example, gains applied to communications signals in the receiver 1500 and transmitter 1520 may be adaptively controlled through automatic gain control algorithms implemented in the DSP 1580.

In a data communications mode, a received signal, such as a text message or web page download, is processed by the communications subsystem 1001 and is input to the processing device 1800. The received signal is then further processed by the processing device 1800 for an output to the display 1600, or alternatively to some other auxiliary I/O device 1060. A device user may also compose data items, such as e-mail messages, using the keypad 1400 and/or some other auxiliary I/O device 1060, such as a touchpad, a rocker switch, a thumb-wheel, or some other type of input device. The composed data items may then be transmitted over the communications network 1401 via the communications subsystem 1001.

In a voice communications mode, overall operation of the device is substantially similar to the data communications mode, except that received signals are output to a speaker 1100, and signals for transmission are generated by a microphone 1120. Alternative voice or audio I/O subsystems, such as a voice message recording subsystem, may also be implemented on the device 1000. In addition, the display 1600 may also be utilized in voice communications mode, for example to display the identity of a calling party, the duration of a voice call, or other voice call related information.

The short-range communications subsystem enables communication between the mobile device 1000 and other proximate systems or devices, which need not necessarily be similar devices. For example, the short-range communications subsystem may include an infrared device and associated circuits and components, or a Bluetooth™ communications module to provide for communication with similarly-enabled systems and devices.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. An electronic device comprising:
   a voltage controlled oscillator (VCO);
   a temperature sensor; and
   a controller configured to
      cooperate with said VCO and said temperature sensor to determine both a temperature and a frequency error of the VCO for each of a plurality of most recent samples, each sample having a given age associated therewith,
      align the temperature, the frequency error, and the given age for each of the plurality of most recent samples in a three-dimensional (3D) coordinate system having respective temperature, frequency error and age axes, and
      estimate a predicted frequency error of said VCO based upon the aligned temperature, frequency error, and given age of the plurality of most recent samples.

2. The electronic device of claim 1, wherein said controller is configured to estimate the predicted frequency error by applying a least squares estimation in the 3D coordinate system.

3. The electronic device of claim 1, wherein said controller is configured to estimate the predicted frequency error based upon a selected estimation algorithm from among a plurality of available estimation algorithms.

4. The electronic device of claim 3, wherein the plurality of estimation algorithms comprises first and second wireless communications signal acquisition rate algorithms, the first wireless communications signal acquisition rate algorithm being configured to acquire a wireless communications signal at a slower rate than the second wireless communications signal acquisition rate algorithm.

5. The electronic device of claim 4, wherein said controller is configured to select the first wireless communications signal acquisition rate algorithm based upon the predicted frequency error being above a threshold.

6. The electronic device of claim 3, wherein said controller is further configured to determine a reliability value of the predicted frequency error and select the given estimation algorithm based upon the reliability value.

7. The electronic device of claim 6, wherein the controller is configured to determine the reliability value as a probability that the predicted frequency error exceeds a threshold probability.

8. The electronic device of claim 7, wherein the controller is configured to estimate the predicted frequency error if the reliability value exceeds the threshold probability.

9. The electronic device of claim 1, further comprising wireless communications circuitry coupled to said controller and configured to perform at least one wireless communications function.

10. The electronic device of claim 9, wherein said controller is configured to cooperate with said wireless communications circuitry to reduce a wireless communications signal acquisition rate if the estimated predicted frequency error exceeds a threshold.

11. The electronic device of claim 1, wherein the plurality of most recent samples is less than 50.

12. The electronic device of claim 1, further comprising:
a portable housing carrying said VCO, said temperature sensor, and said controller; and
wireless communications circuitry coupled to said VCO.

13. A mobile wireless communications device comprising:
a portable housing;
a voltage controlled oscillator (VCO) carried by said portable housing;
a temperature sensor carried by said portable housing;
wireless communications circuitry carried by said portable housing and coupled to said VCO; and
a controller configured to
cooperate with said VCO and said temperature sensor to determine both a temperature and a frequency error of the VCO for each of a plurality of most recent samples, each sample having a given age associated therewith and the plurality of most recent samples being less than 50,
align the temperature, the frequency error, and the given age for each of the plurality of most recent samples in a three-dimensional (3D) coordinate system having respective temperature, frequency error and age axes, and
estimate a predicted frequency error of said VCO based upon the aligned temperature, frequency error, and given age of the plurality of most recent samples.

14. The mobile wireless communications device of claim 13, wherein said controller is configured to estimate the predicted frequency error by applying a least squares estimation in the 3D coordinate system.

15. The mobile wireless communications device of claim 13, wherein said controller is configured to estimate the predicted frequency error based upon a selected estimation algorithm from among a plurality of available estimation algorithms.

16. The mobile wireless communications device of claim 15, wherein the plurality of estimation algorithms comprises first and second wireless communications signal acquisition rate algorithms, the first wireless communications signal acquisition rate algorithm being configured to acquire a wireless communications signal at a slower rate than the second wireless communications signal acquisition rate algorithm.

17. A method of operating an electronic device comprising a voltage controlled oscillator (VCO) and a temperature sensor coupled to the VCO, the method comprising:
sensing a temperature using the temperature sensor;
determining a frequency error of the VCO for each of a plurality of most recent samples based upon the sensed temperature, each sample having a given age associated therewith;
aligning the temperature, the frequency error, and the given age for each of the plurality of most recent samples in a three-dimensional (3D) coordinate system having respective temperature, frequency error and age axes;
estimating a predicted frequency error of the VCO based upon the aligned temperature, frequency error, and given age of the plurality of most recent samples; and
controlling the VCO based upon the predicted frequency error.

18. The method of claim 17, wherein the predicted frequency error is estimated by applying a least squares estimation in the 3D coordinate system.

19. The method of claim 17, wherein the predicted frequency error is estimated based upon a selected estimation algorithm from among a plurality of available estimation algorithms.

20. The method of claim 19, wherein the plurality of estimation algorithms comprises first and second wireless communications signal acquisition rate algorithms, the first wireless communications signal acquisition rate algorithm acquires a wireless communications signal at a slower rate than the second wireless communications signal acquisition rate algorithm.

21. The method of claim 20, further comprising selecting the first wireless communications signal acquisition rate algorithm based upon the predicted frequency error being above a threshold.

22. The method of claim 19, further comprising determining a reliability value of the predicted frequency error and selecting the given estimation algorithm based upon the reliability value.

23. A non-transitory computer-readable medium for use with an electronic device comprising a voltage controlled oscillator (VCO) and a temperature sensor, the non-transitory computer-readable medium having computer-executable instructions for causing the electronic device to perform steps comprising:
cooperating with the VCO and the temperature sensor to determine both a temperature and a frequency error of the VCO for each of a plurality of most recent samples, each sample having a given age associated therewith;
aligning the temperature, the frequency error, and the given age for each of the plurality of most recent samples in a three-dimensional (3D) coordinate system having respective temperature, frequency error and age axes; and
estimating a predicted frequency error of the VCO based upon the aligned temperature, frequency error, and given age of the plurality of most recent samples.

24. The non-transitory computer-readable medium of claim 23, wherein the computer-executable instructions are for causing the electronic device to perform the step of estimating the predicted frequency error by applying a least squares estimation in the 3D coordinate system.

25. The non-transitory computer-readable medium of claim 23, wherein the computer-executable instructions are for causing the electronic device to perform the step of estimating the predicted frequency error based upon a selected estimation algorithm from among a plurality of available estimation algorithms.

26. The non-transitory computer-readable medium of claim 25, wherein the plurality of estimation algorithms comprises first and second wireless communications signal acquisition rate algorithms, the first wireless communications signal acquisition rate algorithm acquires a wireless communications signal at a slower rate than the second wireless communications signal acquisition rate algorithm.

27. The non-transitory computer-readable medium of claim 26, wherein the computer-executable instructions are for causing the electronic device to perform the step of selecting the first wireless communications signal acquisition rate algorithm based upon the predicted frequency error being above a threshold.

28. The non-transitory computer-readable medium of claim 26, wherein the computer-executable instructions are for causing the electronic device to perform the step of determining a reliability value of the predicted frequency error and select the given estimation algorithm based upon the reliability value.

* * * * *